(12) United States Patent
Tsai et al.

(10) Patent No.: US 10,120,816 B2
(45) Date of Patent: Nov. 6, 2018

(54) BAD COLUMN MANAGEMENT WITH DATA SHUFFLE IN PIPELINE

(71) Applicant: SANDISK TECHNOLOGIES LLC, Plano, TX (US)

(72) Inventors: Wanfang Tsai, Palo Alto, CA (US); Yan Li, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 35 days.

(21) Appl. No.: 15/458,561

(22) Filed: Mar. 14, 2017

(65) Prior Publication Data

US 2018/0024948 A1 Jan. 25, 2018

Related U.S. Application Data

(60) Provisional application No. 62/365,180, filed on Jul. 21, 2016, provisional application No. 62/364,519, filed on Jul. 20, 2016.

(51) Int. Cl.
*G06F 13/16* (2006.01)
*G06F 5/06* (2006.01)
(Continued)

(52) U.S. Cl.
CPC .......... *G06F 13/1673* (2013.01); *G06F 3/061* (2013.01); *G06F 3/0655* (2013.01);
(Continued)

(58) Field of Classification Search
None
See application file for complete search history.

(56) References Cited

U.S. PATENT DOCUMENTS 5,200,959 A * 4/1993 Gross ................... G11C 29/765
  714/6.13
5,297,148 A * 3/1994 Harari .................. G06F 3/0601
  365/185.09
(Continued)

FOREIGN PATENT DOCUMENTS

CN 103279424 A * 9/2013

OTHER PUBLICATIONS

'Independent Bad Block Management for Mass Storage Flash Memory Arrays' by Yongfeng Ma et al., copyright 2015, IEEE.*
(Continued)

*Primary Examiner* — Steven Snyder
(74) *Attorney, Agent, or Firm* — Vierra Magen Marcus LLP

(57) ABSTRACT

Systems and methods for controlling data flow and data alignment using data expand and compress circuitry arranged between a variable data rate bi-directional first in, first out (FIFO) buffer and one or more memory arrays to compensate for bad column locations within the one or more memory arrays are described. The bi-directional FIFO may have a variable data rate with the array side and a fixed data rate with a serializer/deserializer (SERDES) circuit that drives input/output (I/O) circuitry. The data expand and compress circuitry may pack and unpack data and then align the data passing between the one or more memory arrays and the bi-directional FIFO using a temporary buffer, data shuffling logic, and selective pipeline stalls.

20 Claims, 23 Drawing Sheets

(51) Int. Cl.
  G11C 16/34 (2006.01)
  G06F 3/06 (2006.01)
  G11C 16/04 (2006.01)
  G11C 16/10 (2006.01)
  G11C 29/00 (2006.01)
  G11C 7/10 (2006.01)
(52) U.S. Cl.
  CPC ............ G06F 3/0688 (2013.01); G06F 5/065 (2013.01); G06F 13/1642 (2013.01); G11C 7/106 (2013.01); G11C 7/1039 (2013.01); G11C 16/0483 (2013.01); G11C 16/10 (2013.01); G11C 16/3427 (2013.01); G11C 16/3436 (2013.01); G11C 16/3454 (2013.01); G11C 29/84 (2013.01); *G06F 2205/067* (2013.01); *G06F 2212/2022* (2013.01); *G06F 2212/7203* (2013.01); *G11C 7/1066* (2013.01)

(56) References Cited

U.S. PATENT DOCUMENTS

| | | | | |
|---|---|---|---|---|
| 6,034,891 A * | 3/2000 | Norman | ................ | G11C 16/06 365/185.09 |
| 6,035,432 A * | 3/2000 | Jeddeloh | ............. | G11C 29/765 714/710 |
| 6,865,125 B2 * | 3/2005 | Tanzawa | ............. | G11C 11/5628 365/185.03 |
| 7,802,152 B2 * | 9/2010 | Brune | .................... | G11C 29/76 365/185.01 |
| 8,040,727 B1 | 10/2011 | Harrari | | |
| 8,711,625 B2 * | 4/2014 | Li | ........................ | G11C 29/808 365/185.09 |
| 8,842,473 B2 * | 9/2014 | Tsai | .................... | G11C 29/848 365/185.09 |
| 8,892,968 B2 * | 11/2014 | Hsiao | ................. | G06F 11/1048 714/710 |
| 8,947,933 B2 * | 2/2015 | Tokiwa | ............. | G11C 16/0483 365/185.05 |
| 9,490,035 B2 * | 11/2016 | Tsai | ..................... | G11C 29/808 |
| 9,514,843 B2 * | 12/2016 | Huang | .................... | G11C 29/30 |
| 9,583,220 B2 * | 2/2017 | Tsai | ..................... | G11C 29/808 |
| 9,748,001 B2 * | 8/2017 | Li | ........................ | G11C 29/00 |
| 9,754,642 B2 * | 9/2017 | Takagiwa | .............. | G11C 7/106 |
| 2002/0036925 A1 * | 3/2002 | Tanzawa | ............. | G11C 11/5628 365/185.22 |
| 2004/0264271 A1 * | 12/2004 | Tanzawa | ............. | G11C 11/5628 365/201 |
| 2006/0018157 A1 * | 1/2006 | Kawai | ..................... | G11C 29/82 365/185.09 |
| 2006/0245259 A1 * | 11/2006 | Fukuda | .................. | G11C 16/20 365/185.22 |
| 2009/0083591 A1 * | 3/2009 | Brune | .................... | G11C 16/10 714/718 |
| 2012/0075944 A1 * | 3/2012 | Ide | ........................ | G11C 29/44 365/200 |
| 2012/0297245 A1 * | 11/2012 | Li | ........................ | G11C 29/808 714/15 |
| 2013/0151752 A1 * | 6/2013 | Hsiao | ................. | G06F 11/1048 711/103 |
| 2014/0098609 A1 * | 4/2014 | Tokiwa | ............. | G11C 16/0483 365/185.11 |
| 2014/0286083 A1 | 9/2014 | Shu | | |
| 2015/0143188 A1 * | 5/2015 | Huang | .................... | G11C 29/30 714/723 |
| 2016/0247549 A1 * | 8/2016 | Takagiwa | ............... | G11C 7/106 |
| 2016/0307634 A1 | 10/2016 | Tsai | | |

OTHER PUBLICATIONS

'Error Characterization, Mitigation, and Recovery in Flash-Memory-Based Solid-State Drives' by Yu Cai et al., Proceedings of the IEEE, Sep. 2017.*

PCT International Search Report dated Aug. 30, 2017, PCT Patent Application No. PCT/US2017/034887.

PCT Written Opinion of the Internationl Searching Authority dated Aug. 30, 2017, PCT Patent Application No. PCT/US2017/034887.

* cited by examiner

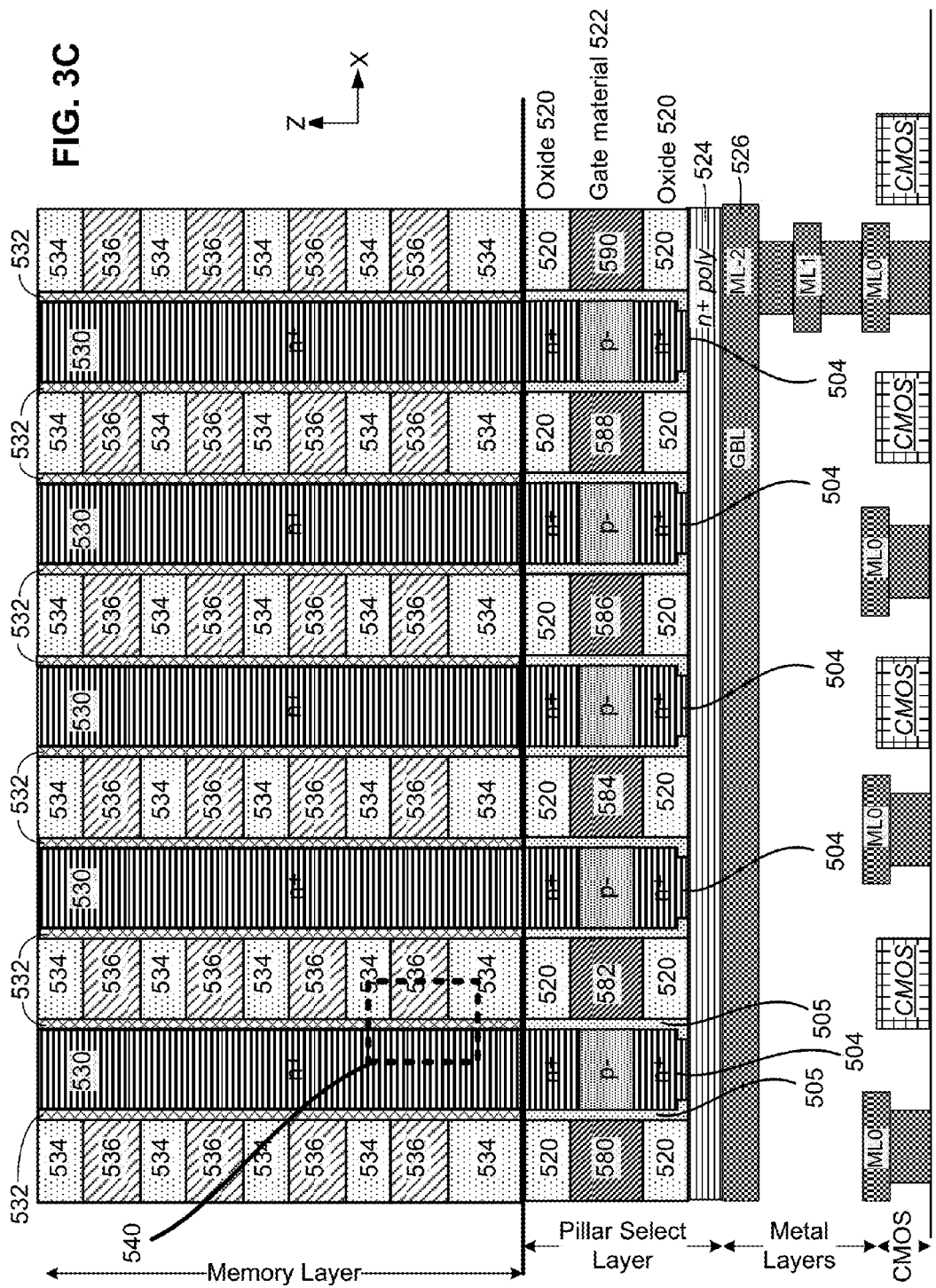

BAD COLUMN MANAGEMENT WITH DATA SHUFFLE IN PIPELINE

CLAIM OF PRIORITY

The present application claims priority to U.S. Provisional Application No. 62/364,519, entitled "High Speed Variable and Fix Data Rate Conversion Data Path in Non-Volatile Memory," filed Jul. 20, 2016, and to U.S. Provisional Application No. 62/365,180, entitled "Non-Volatile Memory Structure," filed Jul. 21, 2016, both of which are herein incorporated by reference in their entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in transistor characteristics and signal delays over process, voltage, and temperature variations.

BRIEF DESCRIPTION OF THE DRAWINGS

FIGS. 3A-3C depict various embodiments of a portion of a three-dimensional memory array.

DETAILED DESCRIPTION

Figure 1A:
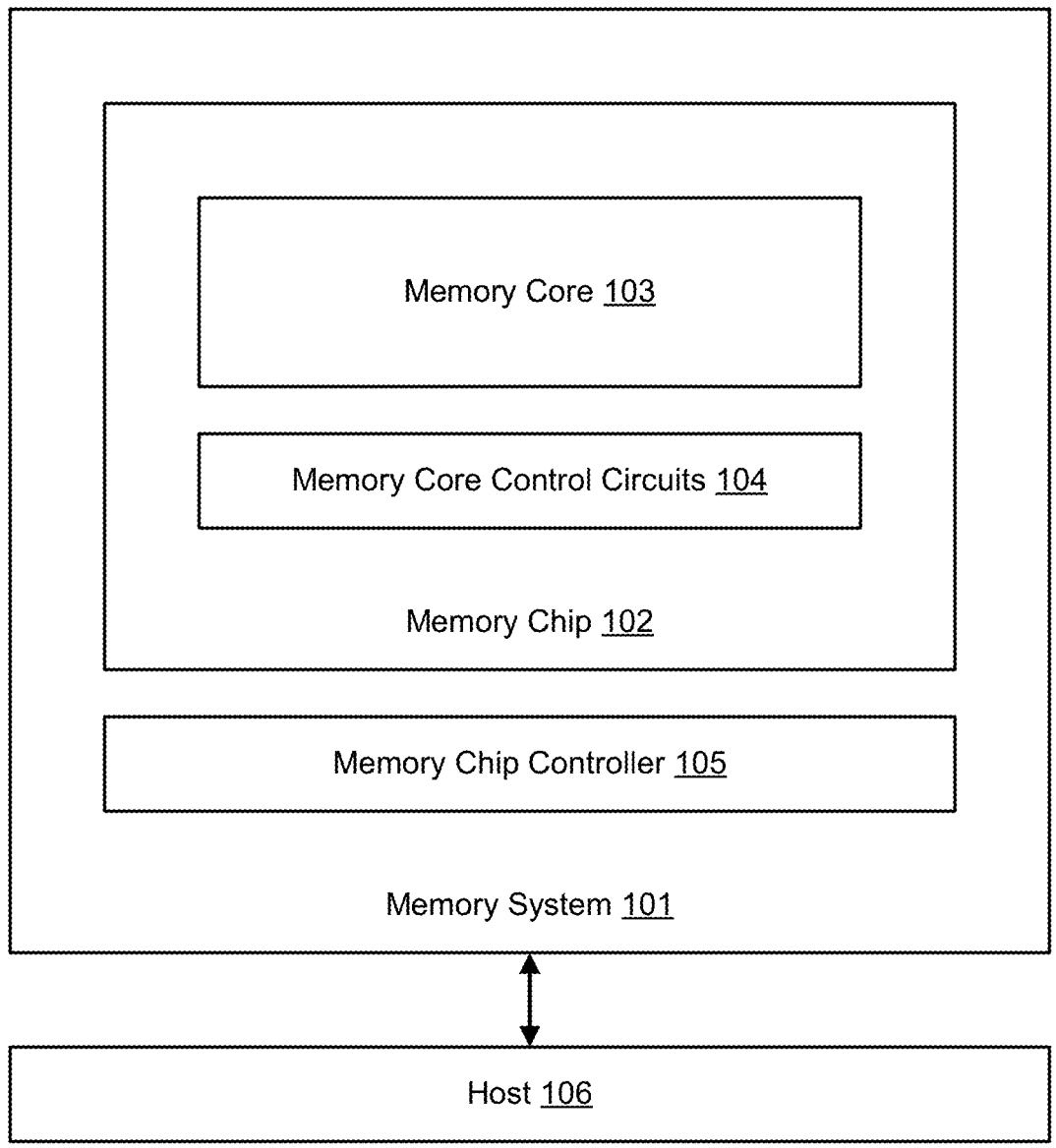
FIGS. 1A-1E depict various embodiments of a memory system.

Technology is described for controlling data flow and data alignment using data expand and compress circuitry arranged between a variable data rate bi-directional first in, first out (FIFO) buffer and one or more memory arrays to compensate for bad column locations within the one or more memory arrays. The bad column locations within the one or more memory arrays may be caused by one or more bit line defects (e.g., a bit line shorted to another line) or defects in a bit line driver or column decoder. The bi-directional FIFO may have a variable data rate with the array side and a fixed data rate with a serializer/deserializer (SERDES) circuit that drives input/output (I/O) circuitry (e.g., for external communication with other memory die or a system controller). In one example, the SERDES circuit may take 64 bits as input at a first data rate and generate and output 4 sets of 16 bits at a second data rate greater than the first data rate (e.g., at 4× the first data rate). The data expand and compress circuitry may pack/unpack data and then align the data passing between the one or more memory arrays and the bi-directional FIFO using a temporary buffer, data shuffling logic, and selective pipeline stalls. One benefit of controlling the data flow and data alignment between the bi-directional FIFO and the one or more memory arrays using the data expand and compress circuitry to compensate for bad column locations within the one or more memory arrays is that the SERDES design may be simplified and overall memory die area may be reduced.

In some cases, a first set of data bytes acquired from the one or more memory arrays (or one or more memory planes) may be realigned and/or shuffled using the data expand and compress circuitry to generate a second set of data bytes with the same number of bytes as the first set of data bytes. The second set of data bytes may be different from the first set of data bytes due to temporarily stored data bytes within a temporary data buffer being transferred to the second set of data bytes. Some of the data bytes within the first set of data bytes may be subsequently stored within the temporary data buffer. The bi-directional FIFO (or bi-directional data buffer) may then store the second set of data bytes (e.g., 8 bytes) that comprises a portion of a page (e.g., 8 bytes out of a 8 kB page size) and the SERDES circuit may take the second set of data bytes and serialize the second set of data bytes to produce multiple sets of data bytes to be outputted from the memory die. The one or more memory arrays may comprise planar NAND structures, vertical NAND structures, Bit Cost Scalable (BiCS) NAND structures, 3D NAND structures, or 3D ReRAM structures.

NAND page sizes have increased over time as NAND storage capacities have increased. While a larger page size (e.g., a 2 kB or 8 kB page size) may allow a greater amount of data to be read or written at a time, it may also increase the data transfer time between a memory controller and a memory die. In some cases, the signaling interface between the memory die and the memory controller may comprise an asynchronous double data rate (DDR) interface or a synchronous DDR interface. The asynchronous double data rate (DDR) interface may provide signaling between the memory controller and the memory die without a continuous periodic clock signal; instead, a bidirectional data strobe signal (e.g., a DQS signal) may be used to facilitate reading from or writing to the memory die. In one example, the bidirectional data strobe signal may be driven by the memory controller when it is writing data to the memory die and may be driven by the memory die when the memory die is sending data to the memory controller. Each rising and falling edge of the data strobe signal may be associated with a data transfer.

In one embodiment, a non-volatile storage system or a memory die may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
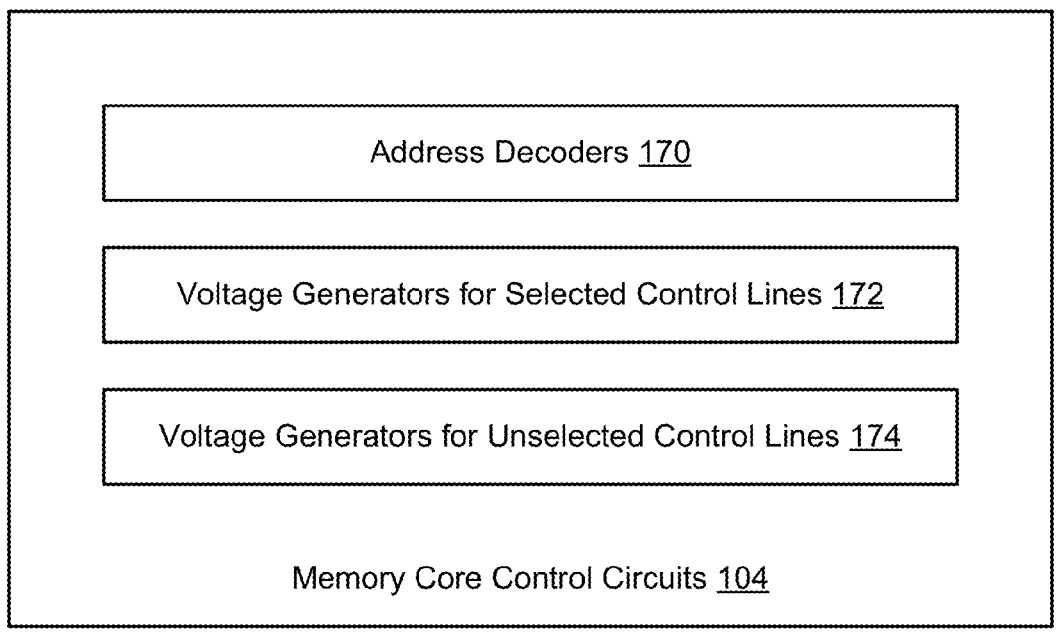

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1C:
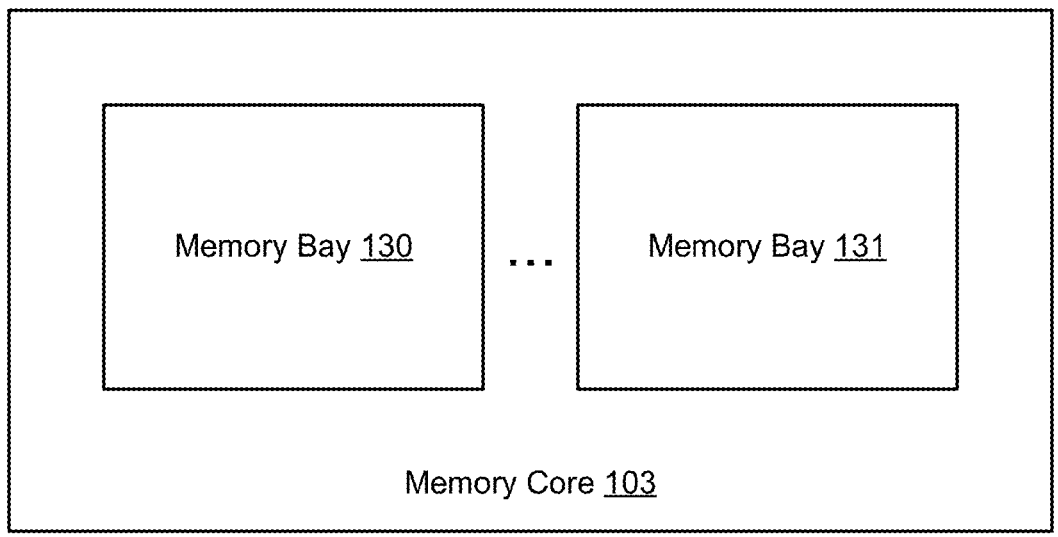
Figure 1D:
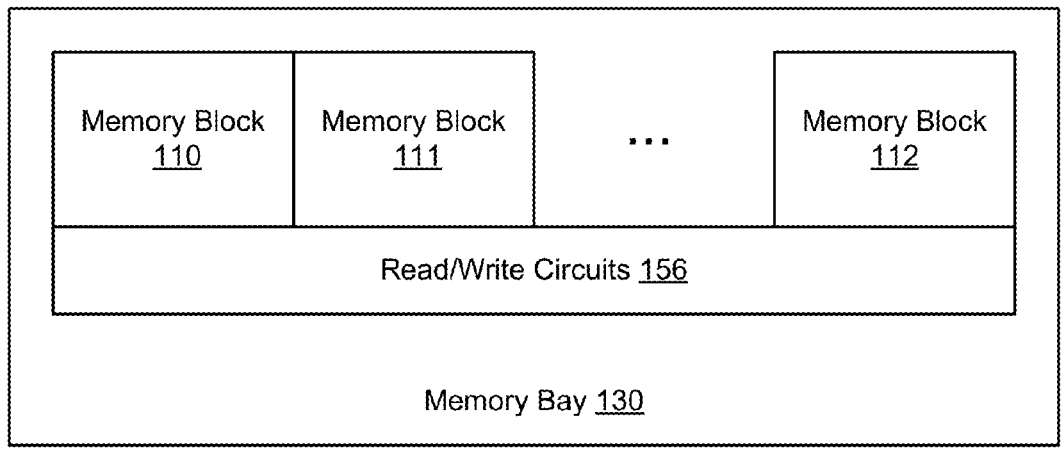
Figure 1E:
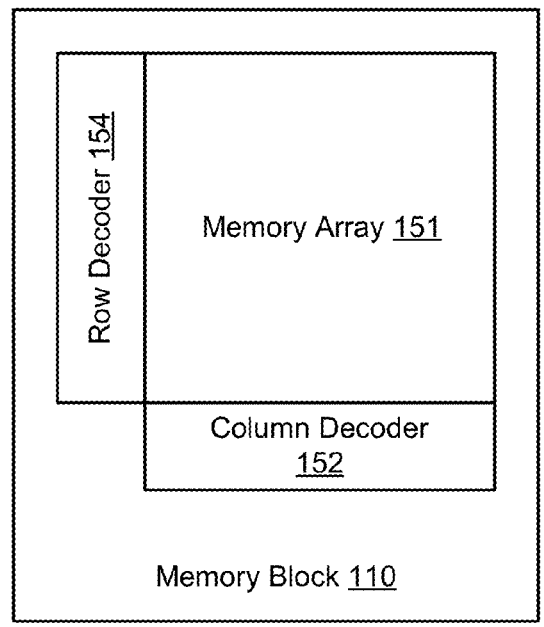

FIGS. 1C-1E depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16 M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2A:
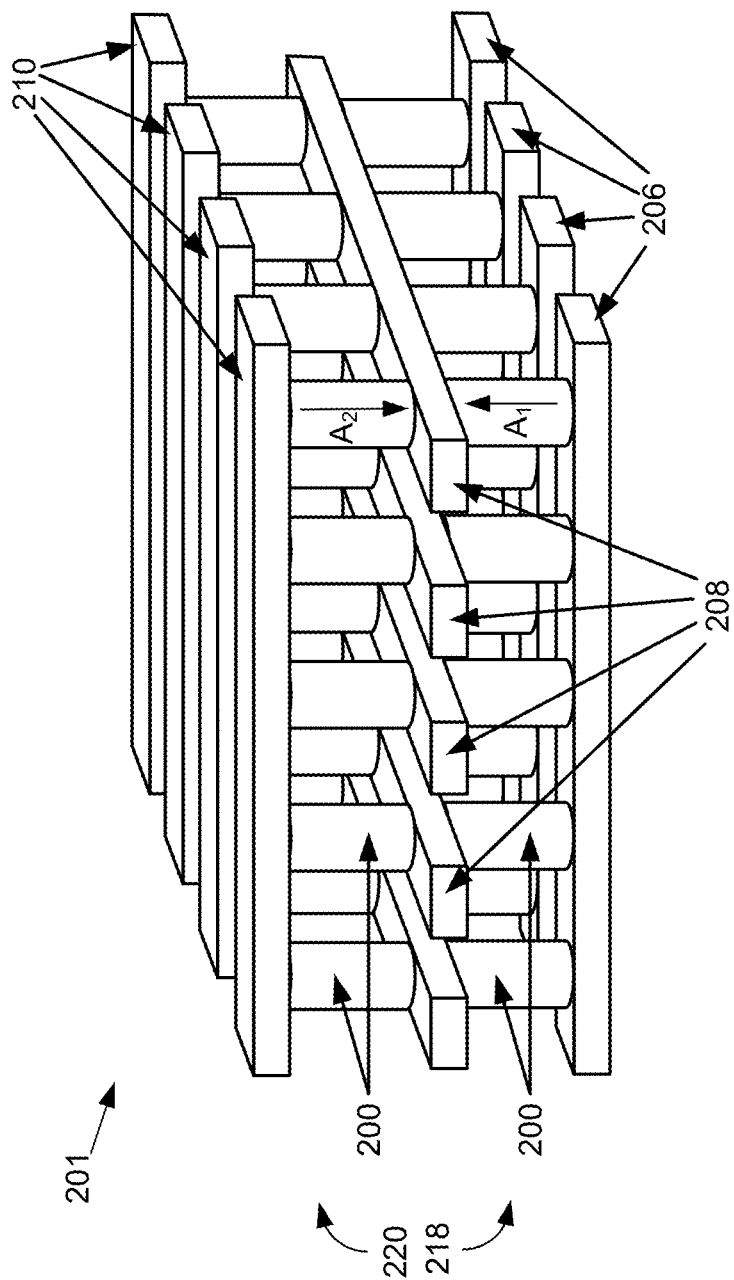
FIGS. 2A-2B depict various embodiments of a cross-point memory array.

FIG. 2A depicts one embodiment of a portion of a monolithic three-dimensional memory array 201 that includes a second memory level 220 positioned above a first memory level 218. Memory array 201 is one example of an implementation for memory array 151 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
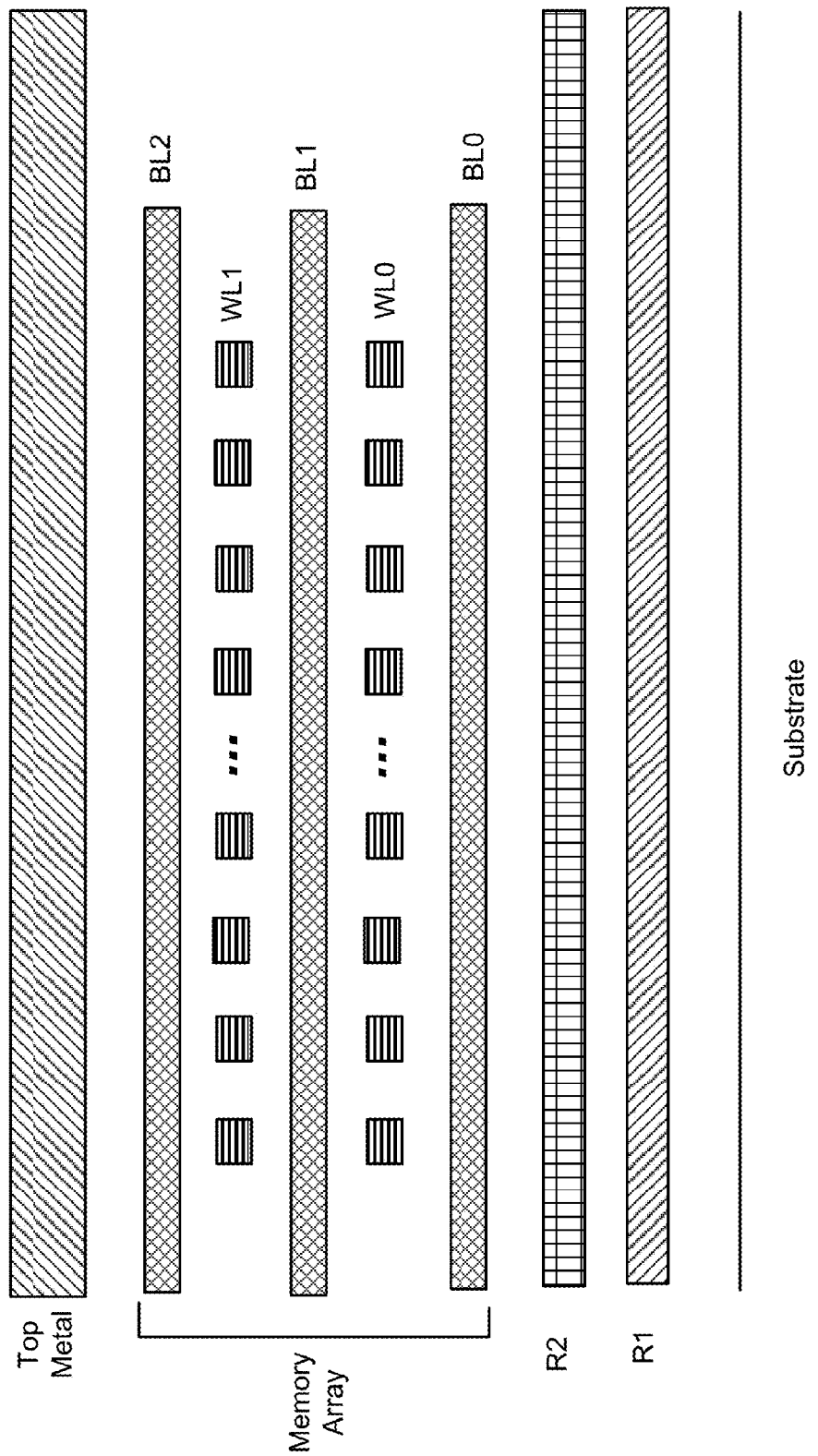

FIG. 2B depicts a subset of the memory array and routing layers of one embodiment of a three-dimensional memory array, such as memory array 151 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
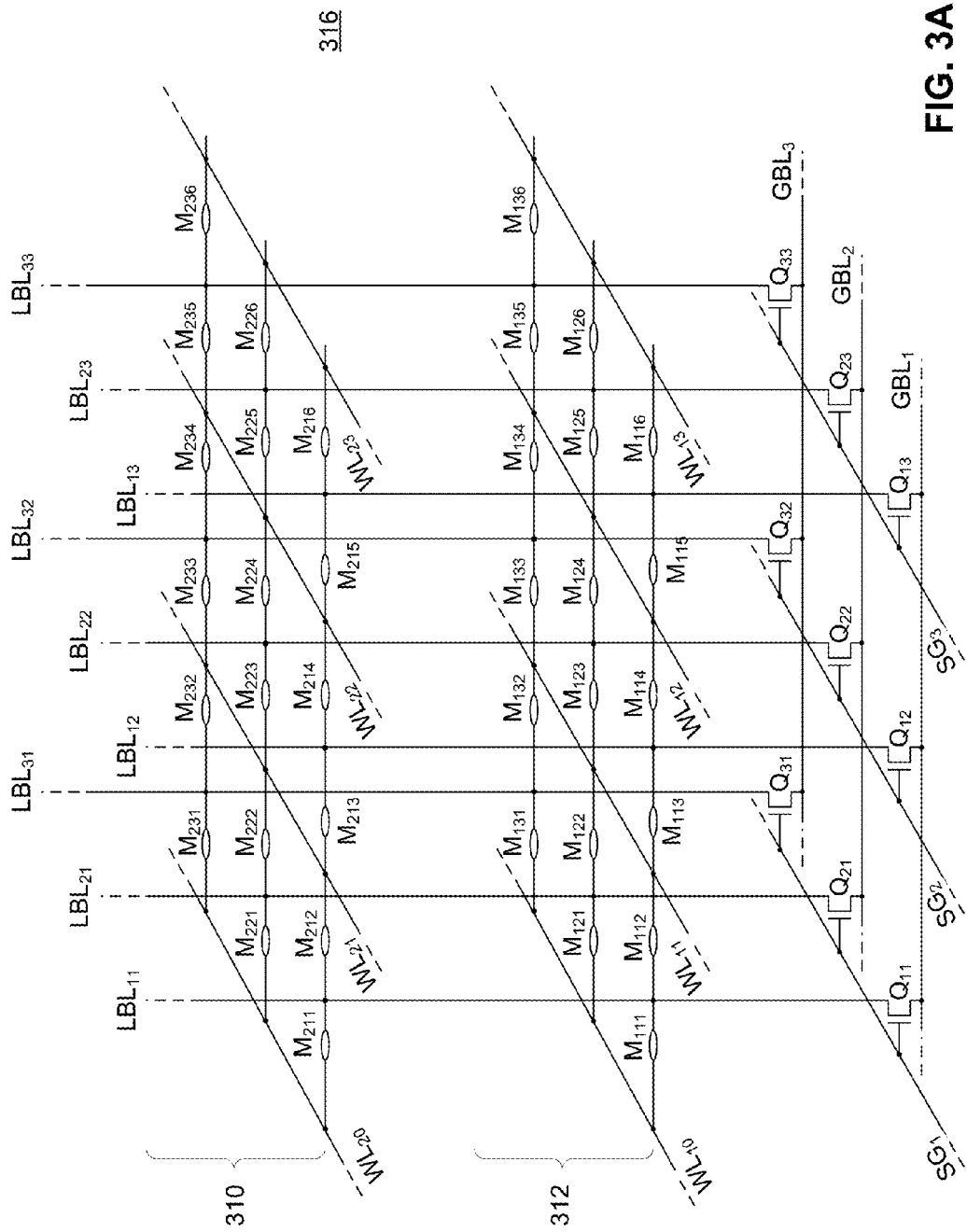

FIG. 3A depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3B:
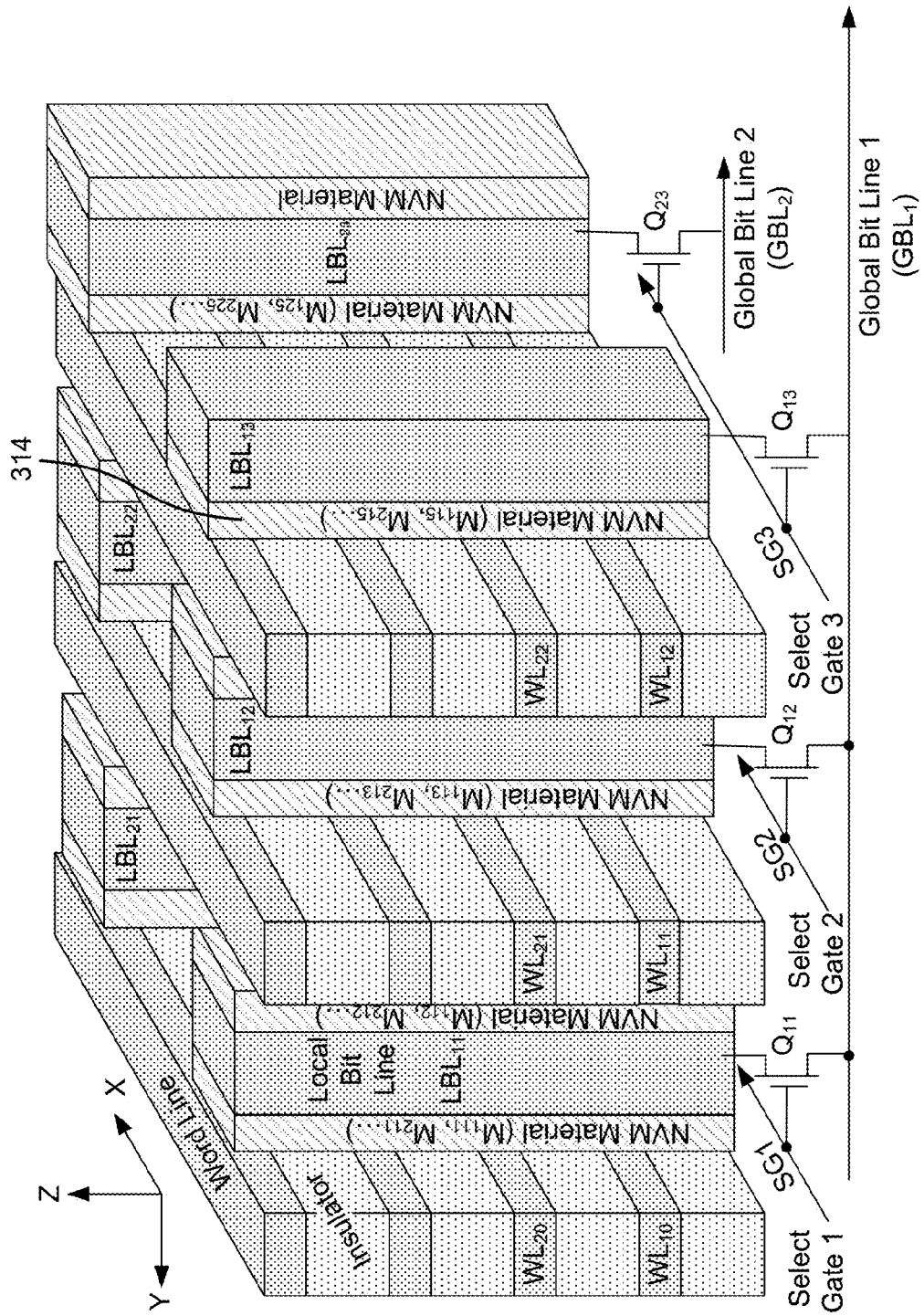

FIG. 3B depicts one embodiment of a portion of a monolithic three-dimensional memory array that includes vertical strips of a non-volatile memory material. The physical structure depicted in FIG. 3B may comprise one implementation for a portion of the monolithic three-dimensional memory array depicted in FIG. 3A. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

FIG. 3C depicts a cross-sectional view of a memory structure using the vertically oriented select devices shown in FIG. 3B. The memory structure of FIG. 3C may comprise a continuous mesh array of memory elements because there are memory elements connected to both sides of the bit lines and memory elements connected to both sides of the word lines. At the bottom of FIG. 3C, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 3B), which are labeled in FIG. 3C as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 3C also shows an n+ polysilicon layer 524. As depicted, the npn TFT of vertically oriented select devices 504 can be used to connect the global bit line GBL (layer 526) with any of the vertical bit lines 530.

Moreover, FIG. 3C shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region, which may allow the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 4A:
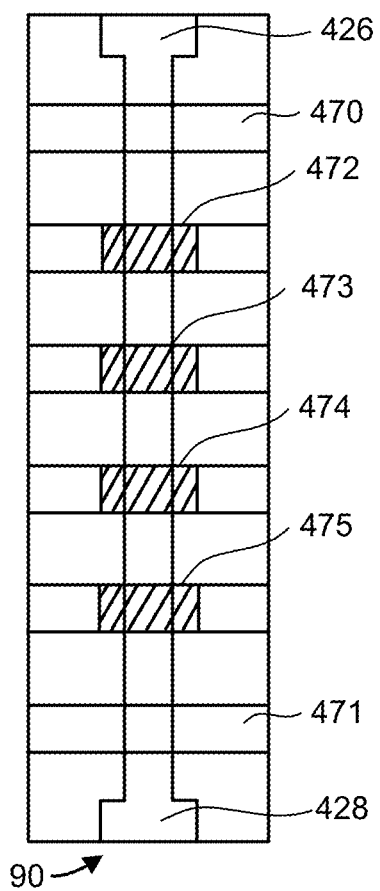
FIG. 4A depicts one embodiment of a NAND string.
Figure 4B:
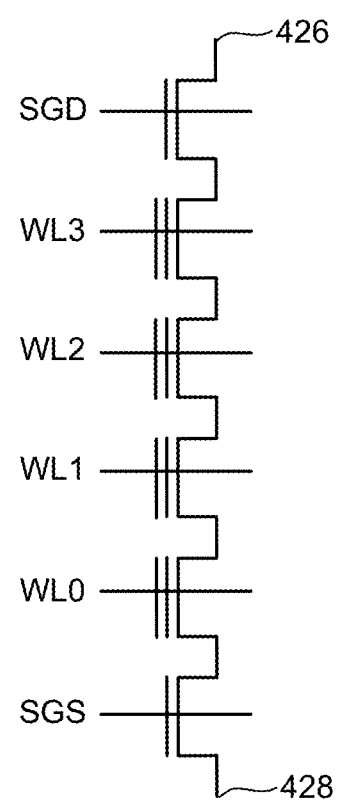
FIG. 4B depicts one embodiment of the NAND string of FIG. 4A using a corresponding circuit diagram.

FIG. 4A depicts one embodiment of a NAND string 90. FIG. 4B depicts one embodiment of the NAND string of FIG. 4A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 4A-4B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 4C:
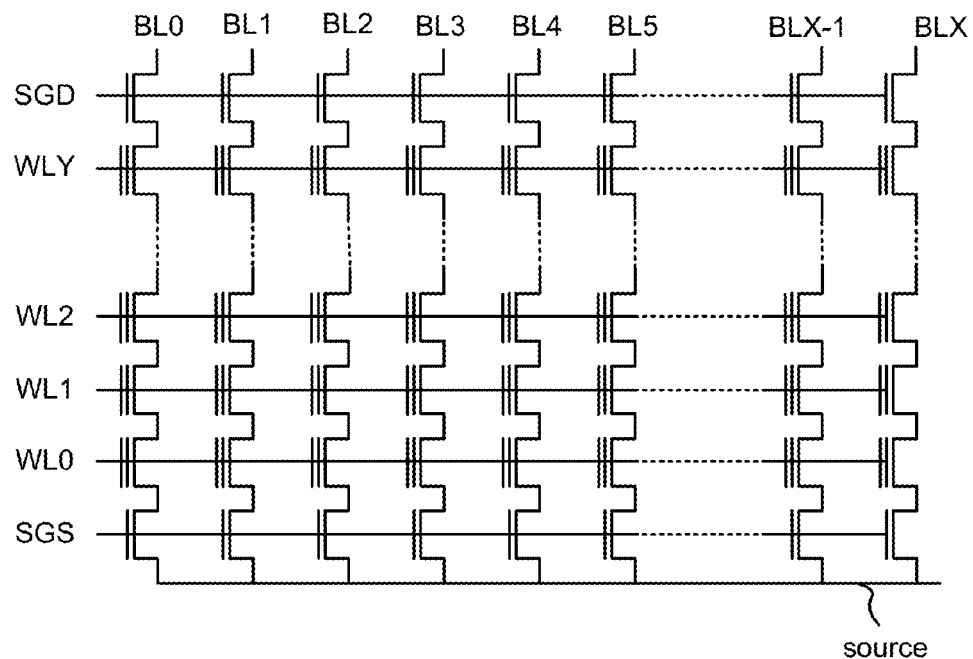
FIG. 4C depicts one embodiment of a memory block including a plurality of NAND strings.

FIG. 4C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the floating gate transistors whose gates are connected to WL0 or the word line closest to the source-side select gate.

Figure 4D:
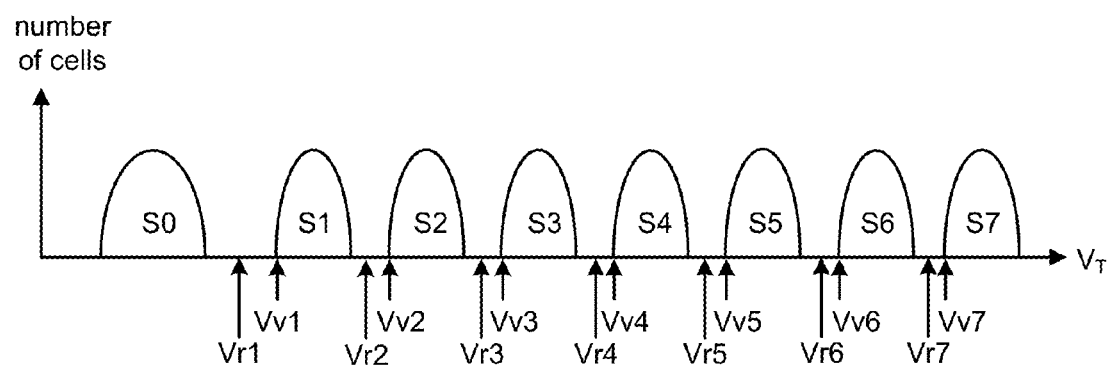
FIG. 4D depicts one embodiment of possible threshold voltage distributions for a three-bit-per-cell memory cell.

FIG. 4D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 5:
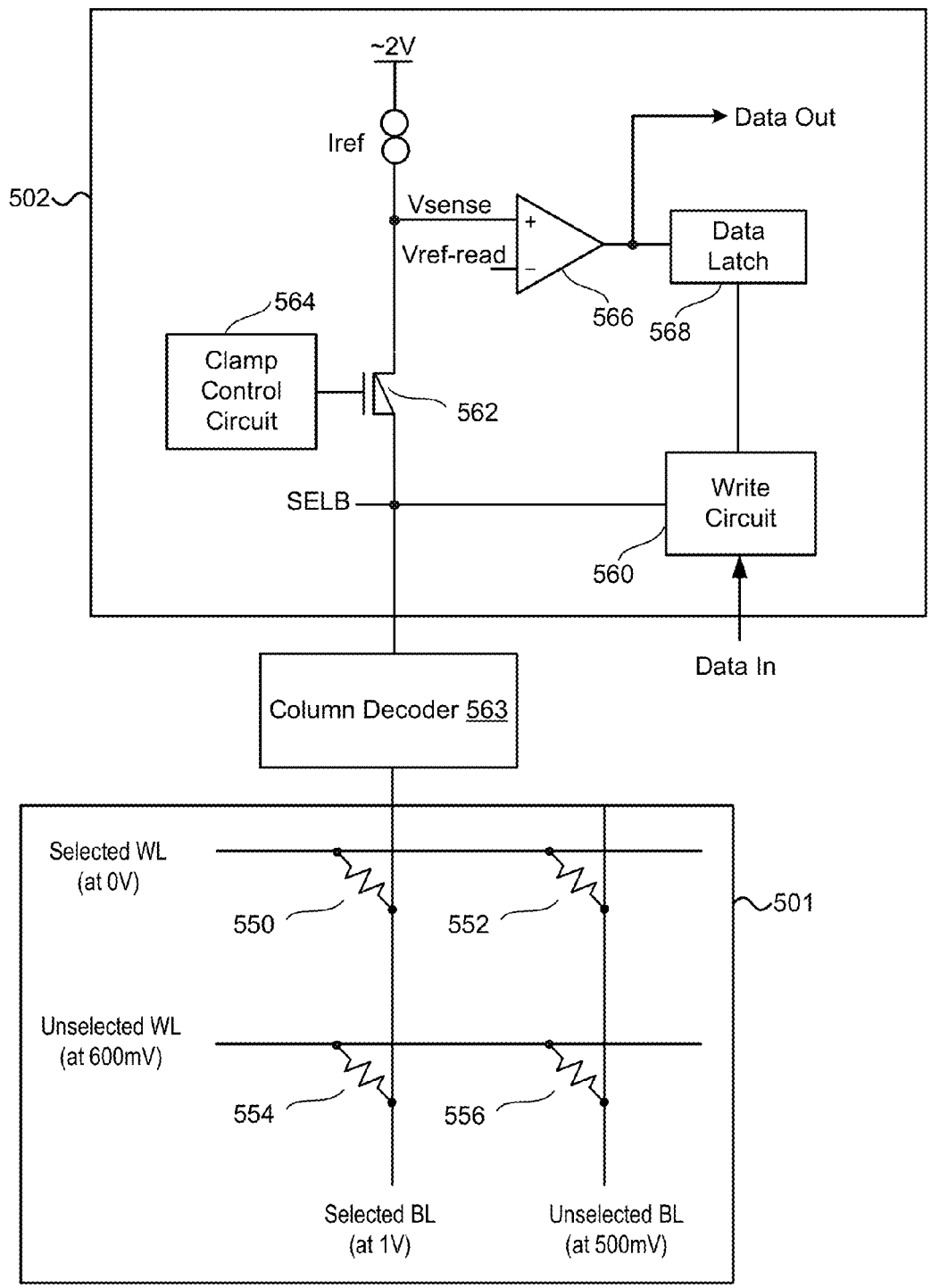
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 3A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Tref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Tref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
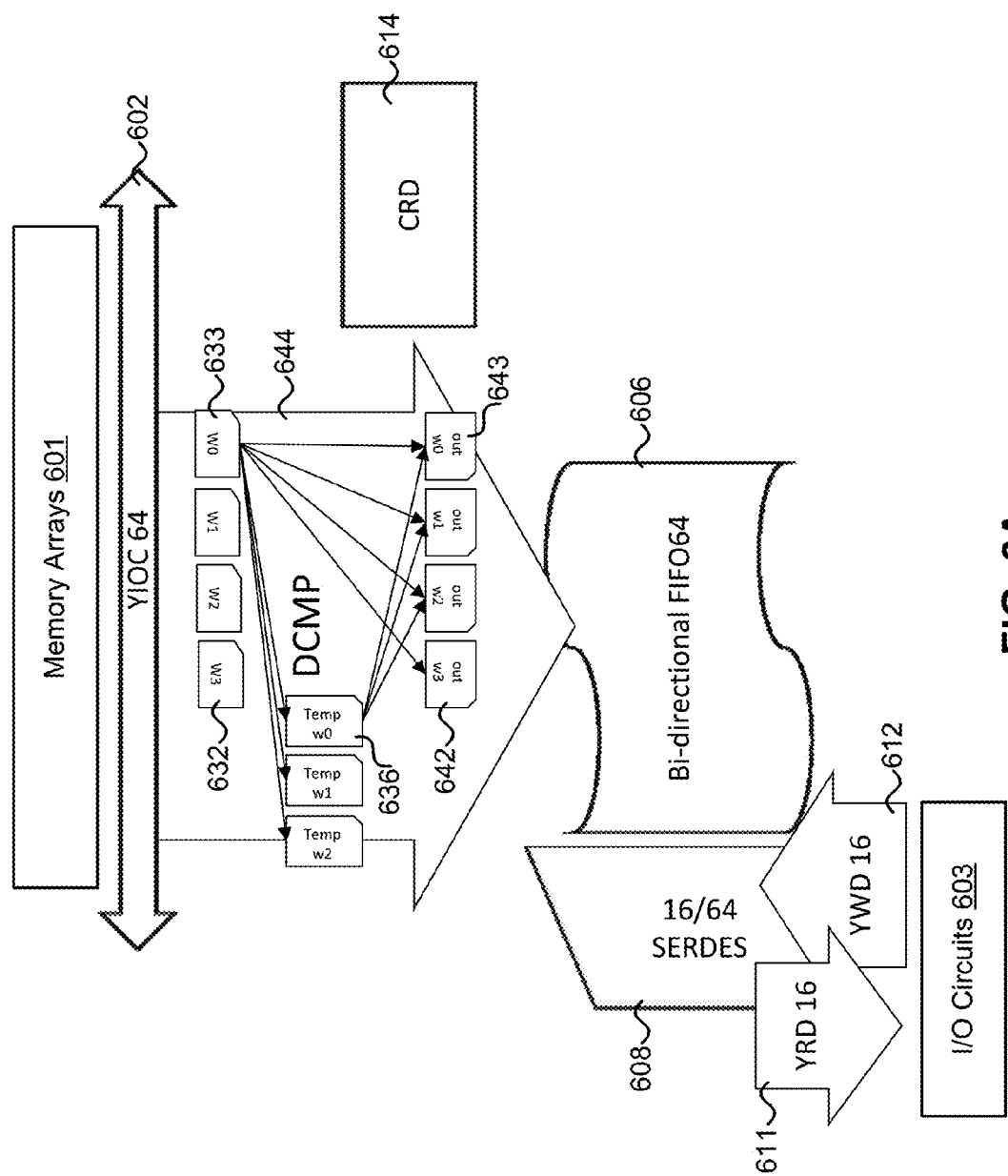
FIG. 6A depicts one embodiment of a portion of a data path between one or more memory arrays and input/output circuitry.

FIG. 6A depicts one embodiment of a portion of a data path between one or more memory arrays and input/output circuitry. As depicted, a 64 bit data bus 602 (YIOC 64) is connected to the one or more memory arrays 601 and to the data compress circuit 644 (DCMP). In some cases, the one or more memory arrays may comprise NAND memory arrays or ReRAM memory arrays. The data compress circuit 644 includes an input register including data storage for four data bytes corresponding with data words W0-W3. In some embodiments, the input register may comprise data storage for two or more data bytes. A first portion 633 of the input register may store the data word W0 and a second portion 632 of the input register may store the data word W3. The data compress circuit 644 also includes a temporary buffer (or a temporary register) for storing temporary words, such as Temp W0-W3. A first portion 636 of the temporary buffer may store the temporary word Temp W0. The data compress circuit 644 includes an output register including data storage for four data bytes corresponding with output data words out W0-W3. A first portion 643 of the output register may store the output data word out W0 and a second portion 642 of the output register may store the output data word out W3. In some embodiments, the output register may comprise data storage for two or more data bytes. Data flow for the data compress circuit 644 flows from the 64 bit data bus 602 to the bi-directional FIFO 606.

In some cases, the data compress circuit 644 may comprise a representative example of means for writing a subset of a first set of data from a temporary buffer to an output register, means for writing a first subset of the second set of data from the input register to the output register, and/or means for writing a second subset of the second set of data from the input register to the temporary buffer.

A column redundancy circuit 614 may identify bad columns within the one or more memory arrays 601 and may include circuitry for controlling the arrangements of data words within the data compress circuit 644. The column redundancy circuit 614 or the data compress circuit 644 may include circuitry not depicted (e.g., multiplexors and control logic for shuffling the data bytes) for mapping each portion of the input register to another portion of the temporary buffer or another portion of the output register.

In one embodiment, a first portion 633 of the input register comprising data storage for a first byte may be moved to one of the three bytes worth of data storage for the temporary buffer or to one of the four bytes worth of data storage for the output register. For example, the first byte may be moved and stored within the temporary buffer as the first temporary byte corresponding with the first portion 636 of the temporary buffer and/or be moved and stored with the output register corresponding with the second portion 642 of the output register. The data compress circuit 644 may include multiple multiplexor circuits or pass transistors for allowing data bytes to be moved and stored between the input register, the temporary buffer, and/or the output register.

The data path between one or more memory arrays and input/output circuitry also includes a bi-directional FIFO 606 (e.g., a data buffer that can store 16 sets of 8 bytes). The bi-directional FIFO 606 is in communication with a SERDES circuit 608 that may convert 64 bits worth of data from the bi-directional FIFO 606 to 4 sets of 16 bits worth of data for the I/O circuits 603. As depicted, a 16 bit output bus 611 may be used to transfer 16 bits of data from the SERDES circuit 608 to the I/O circuits 603 and a 16 bit input bus 612 may be used to transfer 16 bits of data from the I/O circuits 603 to the SERDES circuit 608. The I/O circuits 603 may include off-chip drivers for driving off-chip data lines in order to communicate with external memory die or an off-chip system controller.

Figure 7A:
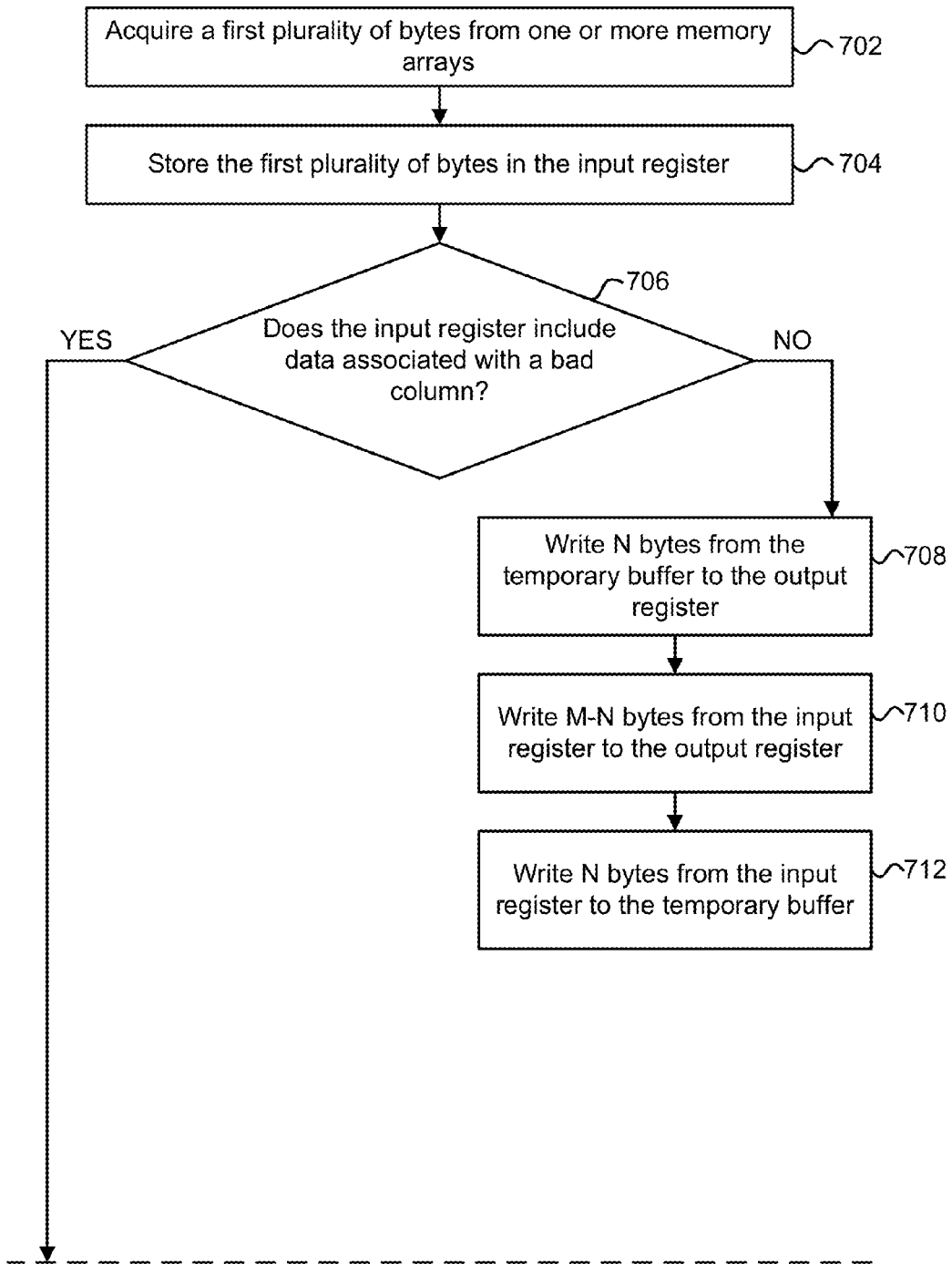
FIGS. 7A-7B depict a flowchart describing one embodiment of a process for controlling data flow and data alignment using data compress circuitry arranged between a bi-directional FIFO and one or more memory arrays to compensate for bad column locations within the one or more memory arrays.
Figure 7B:
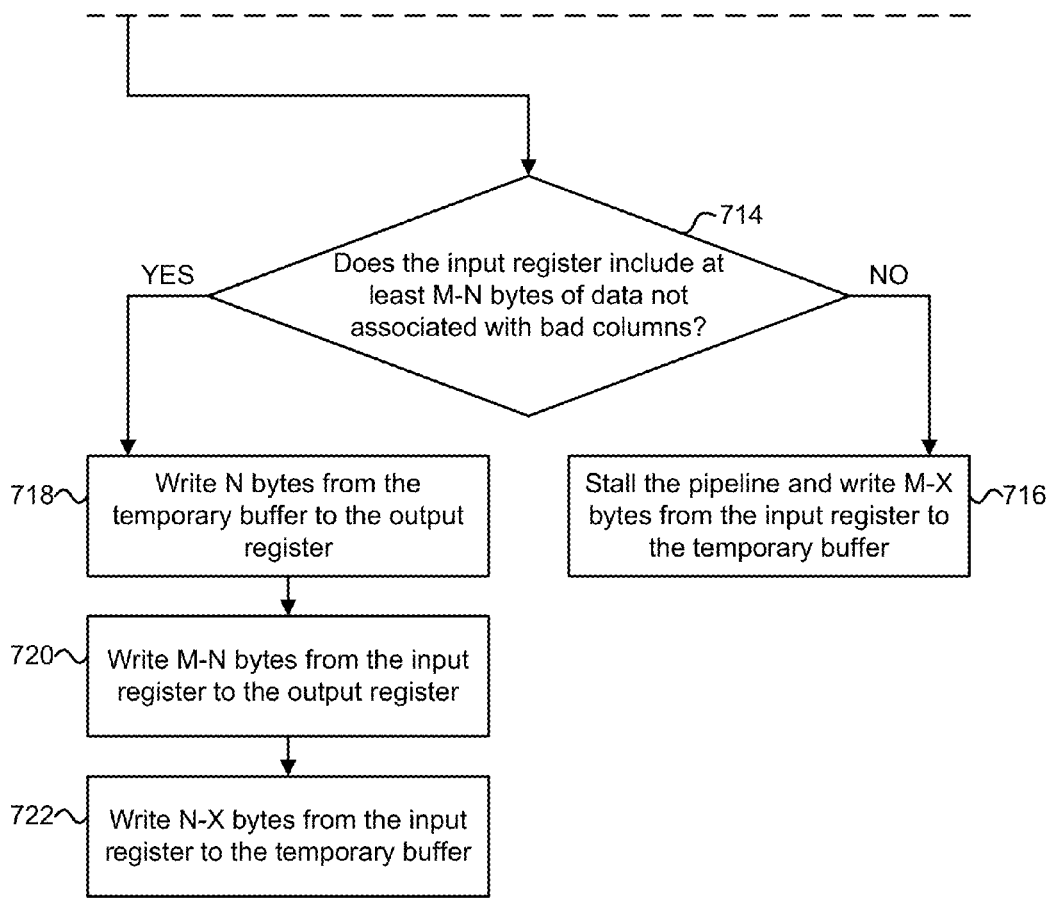

FIGS. 7A-7B depict a flowchart describing one embodiment of a process for controlling data flow and data alignment using data compress circuitry arranged between a bi-directional FIFO and one or more memory arrays to compensate for bad column locations within the one or more memory arrays. In one embodiment, the process of FIGS. 7A-7B may be performed using control circuitry, such as the data compress circuit 644 in FIG. 6A. The data compress circuit 644 may comprise input and output registers of size M bytes.

FIGS. 6B-6I may depict various stages of data transfer within the data compress circuit 644 of FIG. 6A arranged between the bi-directional FIFO and the one or more memory arrays and may be referred to when describing the process of FIGS. 7A-7B. The FIGS. 6B-6I depict an input register comprising data storage for four bytes 681-684, a temporary buffer comprising data storage for four bytes 685-688, and an output register comprising data storage for four bytes 691-694.

In step 702, a first plurality of bytes is acquired from one or more memory arrays. In one example, the first plurality of bytes may comprise four bytes of data. In step 704, the first plurality of bytes is stored in an input register. The input register may comprise data storage for M bytes of data. In one example, the input register may comprise 8*M flip-flops and/or data latches. In another example, the input register may comprise 8*M SRAM cells. In step 706, it is determined whether the input register includes data associated with a bad column within the one or more memory arrays. In one example, a column redundancy circuit, such as the column redundancy circuit 614 in FIG. 6A, may detect that the data within the input register maps to one or more bad columns. If it is determined that the input register includes data associated with a bad column, then step 714 is performed. Otherwise, if the input register does not include data associated with a bad column, then step 708 is performed. In step 708, N bytes are written from the temporary buffer to the output register. Both the input register and the output register may each comprise data storage for M bytes of data. If the temporary buffer does not store any data bytes from a previous acquisition of data from the input register, then N will equal zero bytes. If the temporary buffer stores two data bytes, then N will equal two. The data bytes stored within the temporary buffer may be written to the output register before any bytes from the input register are written to the output register.

In step 710, M-N bytes are written from the input register to the output register. In this case, M-N bytes are written to the output register as N bytes may have already been written from the temporary buffer to the output register. In step 712, N bytes are written from the input register to the temporary buffer.

In step 714, it is determined whether the input register includes at least M-N bytes of data not associated with bad columns. In this case, control logic within the data compress circuit may detect that the input register has bad column data of X bytes and that M-X is less than M-N (i.e., the input register does not have enough good data bytes to entirely fill the output register of M bytes). If it is determined that the input register includes at least M-N bytes of data not associated with bad columns, then step 718 is performed. Otherwise, if the input register does not include at least M-N bytes of data not associated with bad columns, then step 716 is performed. In step 716, the data pipeline from the output register to the bi-directional FIFO is stalled or temporarily stopped from transferring data and M-X bytes are written from the input register to the temporary buffer.

In step 718, N bytes are written from the temporary buffer to the output register. In step 720, M-N bytes are written from the input register to the output register. In step 722, N-X bytes are written from the input register to the temporary buffer. In this case, N-X bytes are written from the input register to the temporary buffer as the X bytes of bad data in the input register are discarded. Once the output register is full with M bytes of good data, then the contents of the output register may be transferred to the bi-directional FIFO.

Figure 6B:
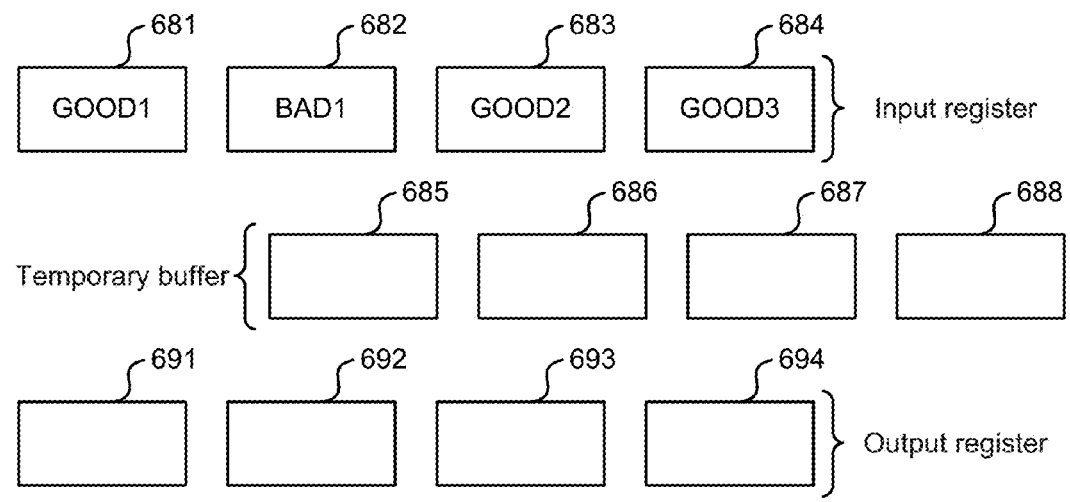
FIGS. 6B-6I may depict various stages of data transfer within the data compress circuit of FIG. 6A.

Referring to FIG. 6B, a first set of four data bytes is loaded and stored within the input register. The first set of four data bytes includes three good data bytes (GOOD1, GOOD2, and GOOD3) and a bad data byte (BAD1) corresponding with a bad column within the one or more memory arrays. The bytes corresponding with bad columns may be identified by the column redundancy circuit 614 in FIG. 6A. The column redundancy circuit 614 may access a mapping of memory addresses to bad columns to determine whether one or more of the bytes within the input register maps to a bad column. In one example, the column redundancy circuit 614 may use a content-addressable memory (CAM) to identify a bad column address. The temporary buffer depicted in FIG. 6B does not include any temporarily stored data bytes (i.e., the temporary buffer is empty).

Figure 6C:
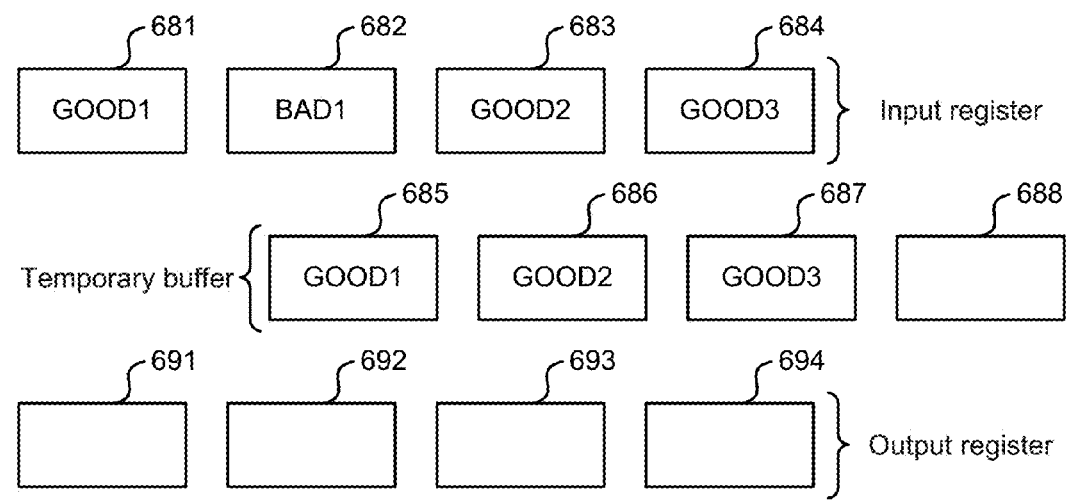
Figure 6D:
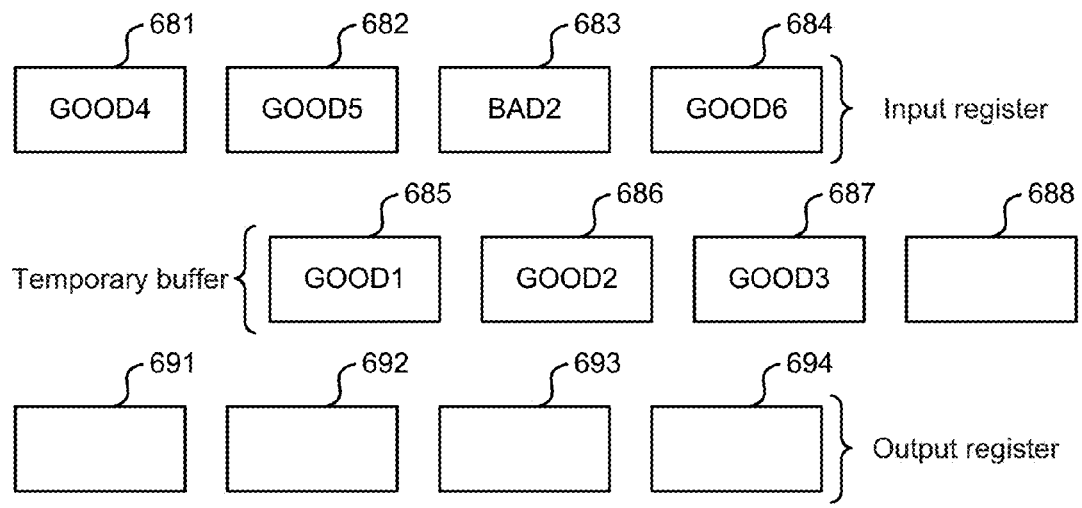
Figure 6E:
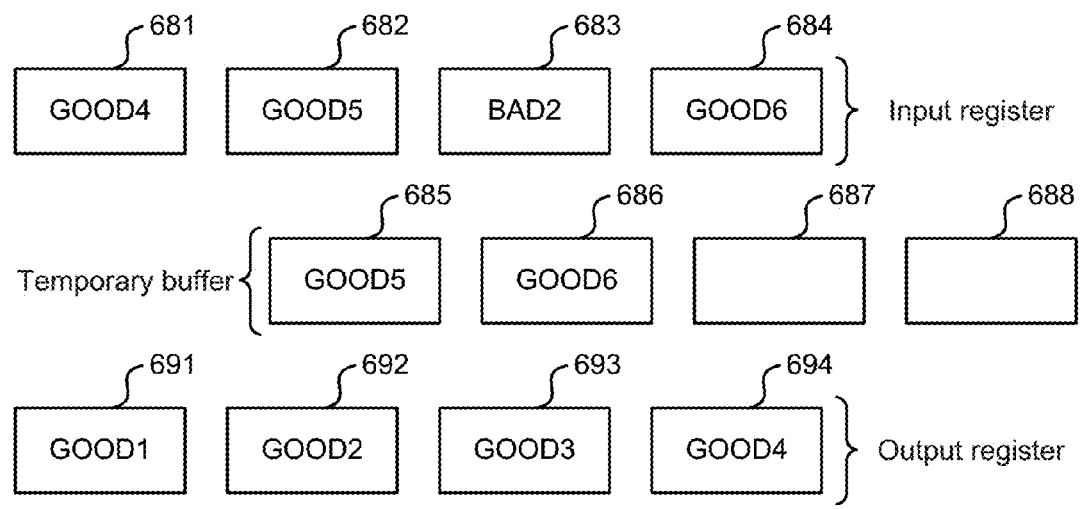

Referring to FIG. 6C, the three good data bytes GOOD1, GOOD2, and GOOD3 are temporarily stored in the temporary buffer. In FIG. 6D, a second set of four data bytes is loaded and stored within the input register. The second set of four data bytes includes three good data bytes (GOOD4, GOOD5, and GOOD6) and a bad data byte (BAD2) corresponding with a bad column within the one or more memory arrays. In FIG. 6E, the three good data bytes GOOD1, GOOD2, and GOOD3 are moved to the output register and one data byte GOOD4 of the three good data bytes in the input register is moved to the output register. The other two good data bytes GOOD5 and GOOD6 are moved and stored within the temporary buffer.

Figure 6F:
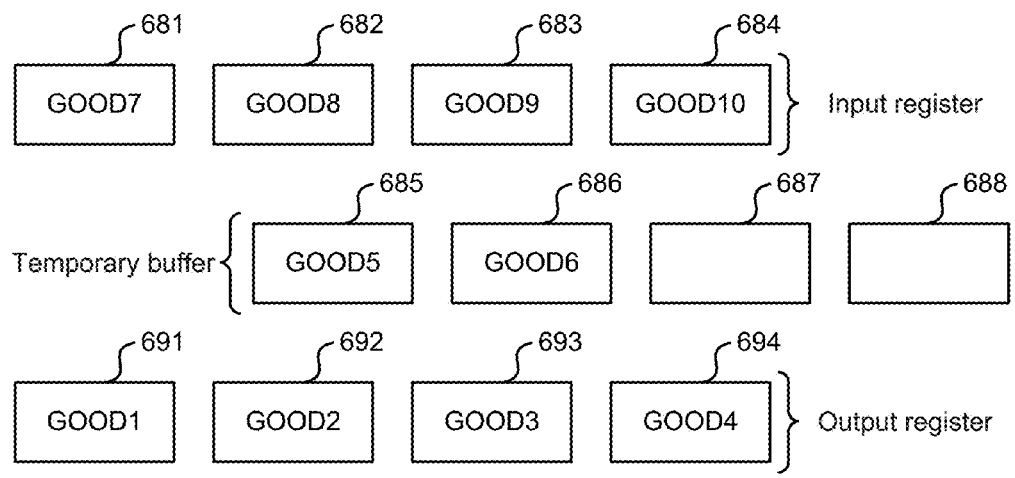
Figure 6G:
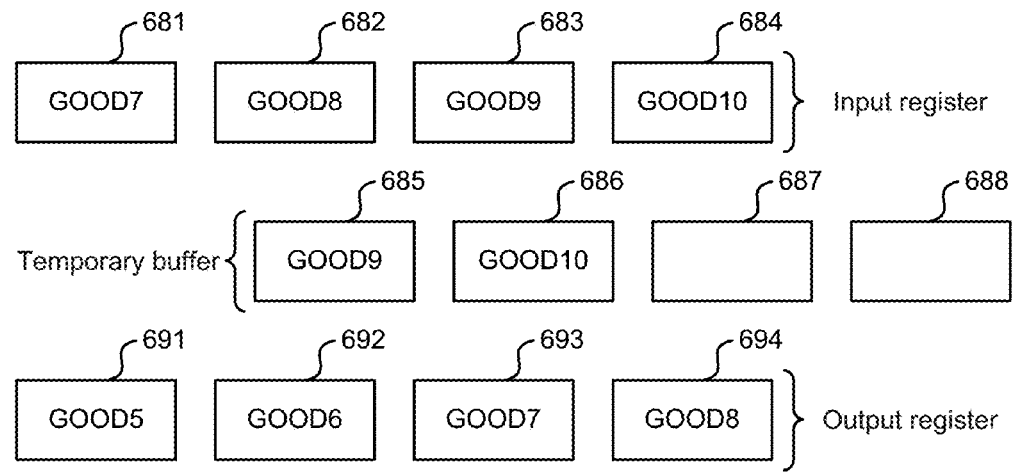

In FIG. 6F, a third set of four data bytes is loaded and stored within the input register. The third set of four data bytes includes four good data bytes (GOOD7, GOOD8, GOOD9, and GOOD10). In FIG. 6G, two good data bytes GOOD7 and GOOD8 of the four good data bytes GOOD7, GOOD8, GOOD9, and GOOD10 are moved to the output register and the remaining two good data bytes GOOD9 and GOOD10 are moved and stored within the temporary buffer.

Figure 6H:
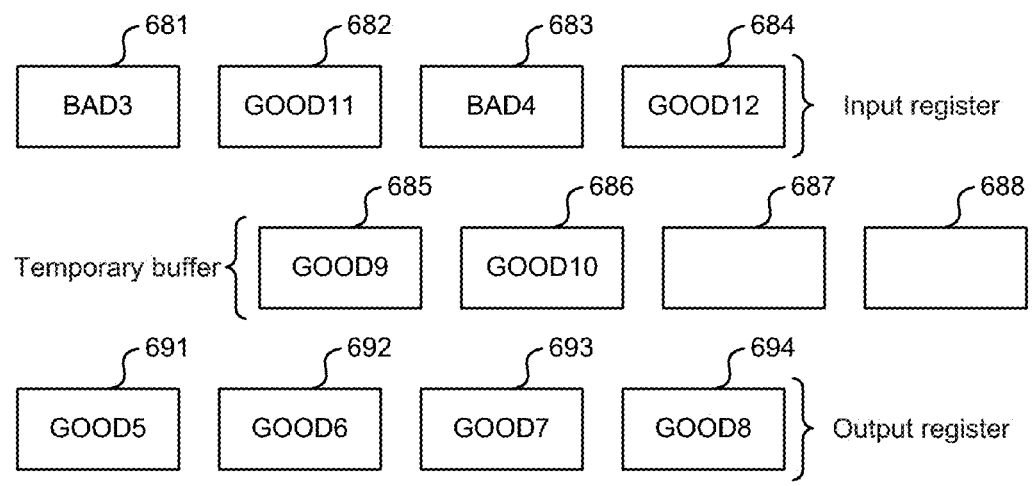
Figure 6I:
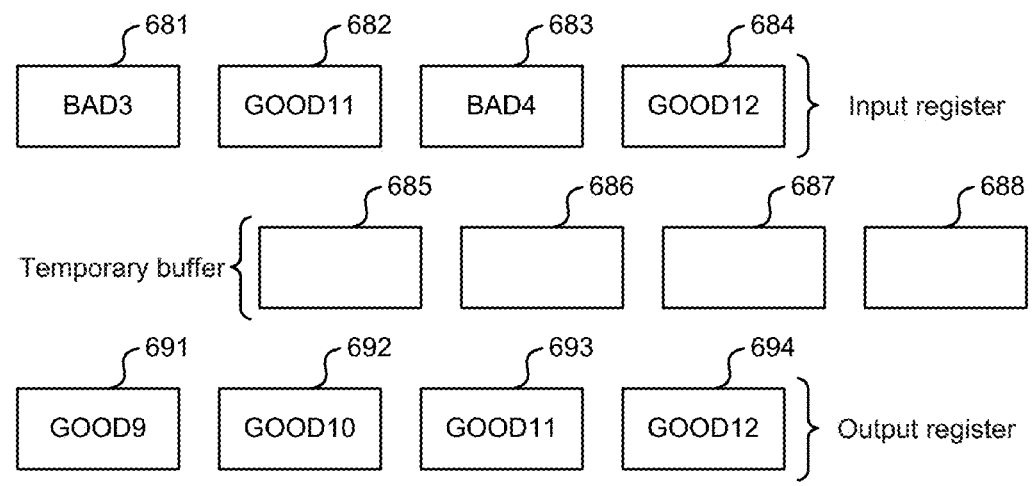

In FIG. 6H, a fourth set of four data bytes is loaded and stored within the input register. The fourth set of four data bytes includes two good data bytes (GOOD11 and GOOD12) and two bad data bytes (BAD3 and BAD4) corresponding with two bad columns within the one or more memory arrays. In FIG. 6I, the two good data bytes within the temporary buffer GOOD9 and GOOD10 are moved to the output register and the two good data bytes within the input register GOOD11 and GOOD12 are moved to the output register. In this case, the temporary buffer does not include any temporarily stored data bytes. Once the output register is entirely filled with good data, then the contents of the output register may be transferred to the bi-directional FIFO.

Figure 6J:
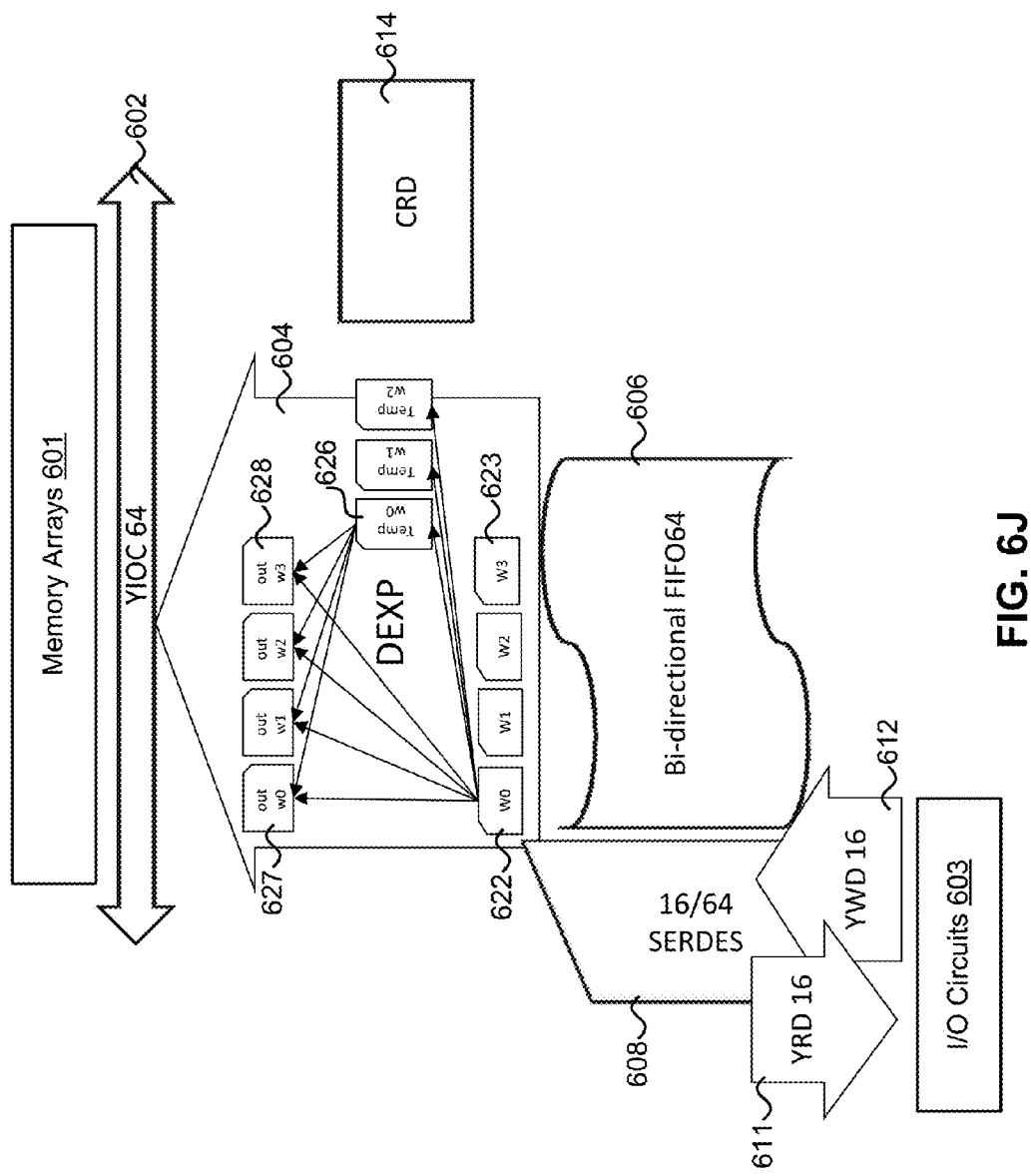
FIG. 6J depicts one embodiment of a portion of a data path between one or more memory arrays and input/output circuitry.

FIG. 6J depicts one embodiment of a portion of a data path between one or more memory arrays and input/output circuitry. As depicted, a 64 bit data bus 602 (YIOC 64) is connected to the one or more memory arrays 601 and to the data expand circuit 604 (DEXP). In some cases, the one or more memory arrays may comprise NAND memory arrays or ReRAM memory arrays. The data expand circuit 604 includes an input register including data storage for four data bytes corresponding with data words W0-W3. A first portion 622 of the input register may store the data word W0 and a second portion 623 of the input register may store the data word W3. The data expand circuit 604 also includes a temporary buffer (or a temporary register) for storing temporary words, such as Temp W0-W3. A first portion 626 of the temporary buffer may store the temporary word Temp W0. The data expand circuit 604 includes an output register including data storage for four data bytes corresponding with output data words out W0-W3. A first portion 627 of the output register may store the output data word out W0 and a second portion 628 of the output register may store the output data word out W3. A column redundancy circuit 614 may identify bad columns within the one or more memory arrays 601 and may include circuitry for controlling the arrangements of data words within the data expand circuit 604. The column redundancy circuit 614 or the data expand circuit 604 may include circuitry for mapping each portion of the input register to another portion of the temporary buffer or another portion of the output register. Data flow for the data expand circuit 604 flows from the bi-directional FIFO 606 to the 64 bit data bus 602.

In one embodiment, a first portion 622 of the input register comprising data storage for a first byte may be moved to one of the three bytes worth of data storage for the temporary buffer or to one of the four bytes worth of data storage for the output register. For example, the first byte may be moved and stored within the temporary buffer as the first temporary byte corresponding with the first portion 626 of the temporary buffer and/or be moved and stored with the output register corresponding with the second portion 628 of the output register. The data expand circuit 604 may include multiple multiplexor circuits for allowing data bytes to be moved and stored between the input register, the temporary buffer, and/or the output register.

As depicted in FIG. 6J, the data path between the one or more memory arrays and the input/output circuitry also includes a bi-directional FIFO 606 (e.g., a data buffer that can store 16 sets of 8 bytes). The bi-directional FIFO 606 is in communication with a SERDES circuit 608 that may convert 4 sets of 16 bits worth of data from the I/O circuits 603 to 64 bits worth of data for the bi-directional FIFO 606. As depicted, a 16 bit output bus 611 may be used to transfer 16 bits of data from the SERDES circuit 608 to the I/O circuits 603 and a 16 bit input bus 612 may be used to transfer 16 bits of data from the I/O circuits 603 to the SERDES circuit 608. The I/O circuits 603 may include off-chip receivers for receiving data from off-chip data lines in order to communicate with external memory die or an off-chip system controller.

Figure 7C:
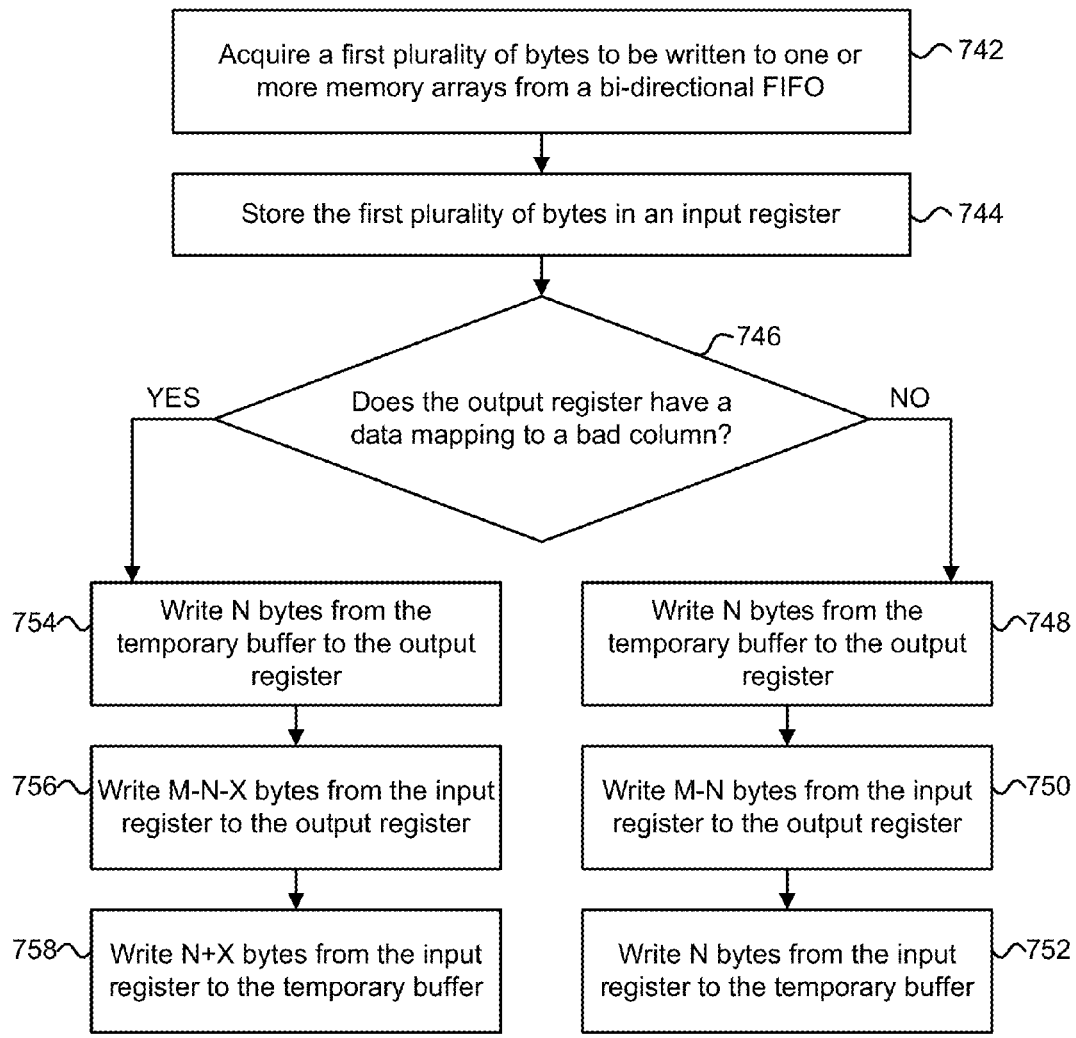
FIG. 7C depicts a flowchart describing one embodiment of a process for controlling data flow and data alignment using data expand circuitry arranged between a bi-directional FIFO and one or more memory arrays to compensate for bad column locations within the one or more memory arrays.

FIG. 7C depicts a flowchart describing one embodiment of a process for controlling data flow and data alignment using data expand circuitry arranged between a bi-directional FIFO and one or more memory arrays to compensate for bad column locations within the one or more memory arrays. In one embodiment, the process of FIG. 7C may be performed using control circuitry, such as the data expand circuit 604 in FIG. 6J. The data expand circuit 604 may comprise input and output registers of size M bytes.

FIGS. 6K-6P may depict various stages of data transfer within the data expand circuit 604 of FIG. 6J arranged between the bi-directional FIFO and the one or more memory arrays and may be referred to when describing the process of FIG. 7C. The FIGS. 6K-6P depict an input register comprising data storage for four data bytes 661-664, a temporary buffer comprising data storage for four data bytes 675-678, and an output register comprising data storage for four data bytes 671-674.

In step 742, a first plurality of bytes is acquired from a bi-directional FIFO. The first plurality of bytes may be intended to be written to one or more memory arrays. In step 744, the first plurality of bytes is stored in an input register, such as the input register depicted in FIG. 6J. In step 746, it is determined whether the output register has a data mapping to a bad column within the one or more memory arrays. In some cases, a bad column detection circuit or a column redundancy circuit, such as the column redundancy circuit 614 in FIG. 6J, may be used to detect that an output register will have a data mapping to one or more bad columns within the memory array. In one example, the output register may comprise 4 bytes of data and the 4 bytes of data may map to four different column addresses within the one or more memory arrays. The column redundancy circuit may detect that one of the 4 bytes of data maps to a bad column based on the column address for that byte. If it is determined that the output register has a data mapping to a bad column within the one or more memory arrays, then step 754 is performed. Otherwise, if it is determined that the output register does not have a data mapping to a bad column within the one or more memory arrays, then step 748 is performed. In step 748, N bytes are written from the temporary buffer to the output register. Both the input register and the output register may each comprise data storage for M bytes of data. If the temporary buffer does not store any data bytes from a previous acquisition of data from the input register, then N will equal zero bytes. If the temporary buffer stores one data byte, then N will equal one. The data bytes stored within the temporary buffer may be written to the output register before any bytes from the input register are written to the output register.

In step 750, M−N bytes are written from the input register to the output register. In step 752, N bytes are written from the input register to the temporary buffer. Once the M−N bytes have been written from the input register to the output register, the data within the output register may be transferred to the one or more memory arrays.

In step 754, N bytes are written from the temporary buffer to the output register. In step 756, M−N−X bytes are written from the input register to the output register. In step 758, N+X bytes are written from the input register to the temporary buffer. In this case, control logic within the data expand circuit may detect that the output register maps to bad column data within the memory arrays of X bytes, and therefore only M−N−X bytes may be written from the input register to the output register as the output register cannot store data intended for bad columns. Once the M−N−X bytes have been written from the input register to the output register, the data within the output register may be transferred to the one or more memory arrays. In one example, the output register depicted in FIG. 6K maps to one bad column, while the output register depicted in FIG. 6M maps to zero bad columns.

Figure 6K:
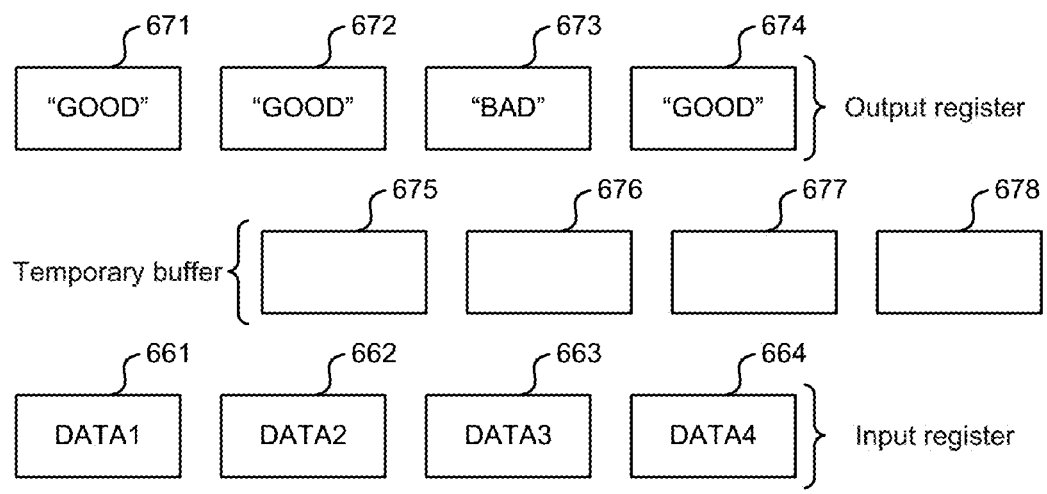
FIGS. 6K-6P may depict various stages of data transfer within the data expand circuit of FIG. 6J.

Referring to FIG. 6K, a first set of four data bytes is loaded and stored within the input register corresponding with the data storage for four data bytes 661-664. In one example, the input register may comprise 8*M flip-flops and/or data latches. In another example, the input register may comprise 8*M SRAM cells. The first set of four data bytes includes four good data bytes DATA1, DATA2, DATA3, and DATA4. As depicted in FIG. 6K, the output register maps to three good data bytes corresponding with portions of the output register 671, 672, and 674 and one bad data byte corresponding with portion of the output register 673. In this case, data bytes stored within the portions of the output register 671, 672, and 674 will map to good columns within the one or more memory arrays, while the data byte stored within the portion of the output register 673 will map to a bad column within the one or more memory arrays and therefore will not be loaded with good data from the input register or the temporary buffer. The byte locations within the output register corresponding with bad columns within the one or more memory arrays may be identified by the column redundancy circuit 614 in FIG. 6J. The column redundancy circuit 614 may access a mapping of memory addresses to bad columns to determine whether one or more of the bytes within the output register maps to a bad column. In one example, the column redundancy circuit 614 may use a content-addressable memory (CAM) to identify a bad column address. The temporary buffer in FIG. 6K does not include any temporarily stored data bytes.

Figure 6L:
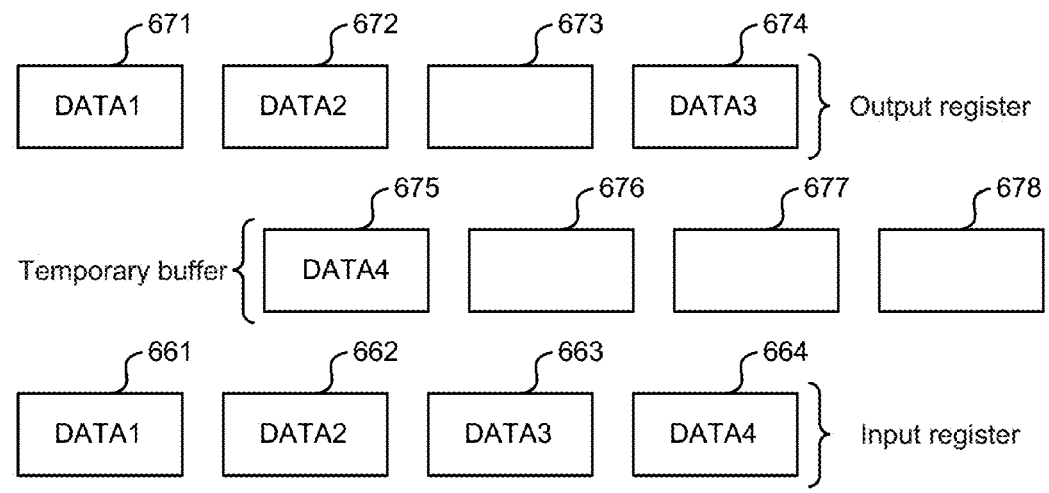

Referring to FIG. 6L, three data bytes DATA1, DATA2, and DATA3 from the first set of four data bytes are moved and stored within the output register within the portions 671, 672, and 674 of the output register. The data byte DATA4 within the input register is moved and stored within the temporary buffer at the portion 675 of the temporary buffer.

Figure 6M:
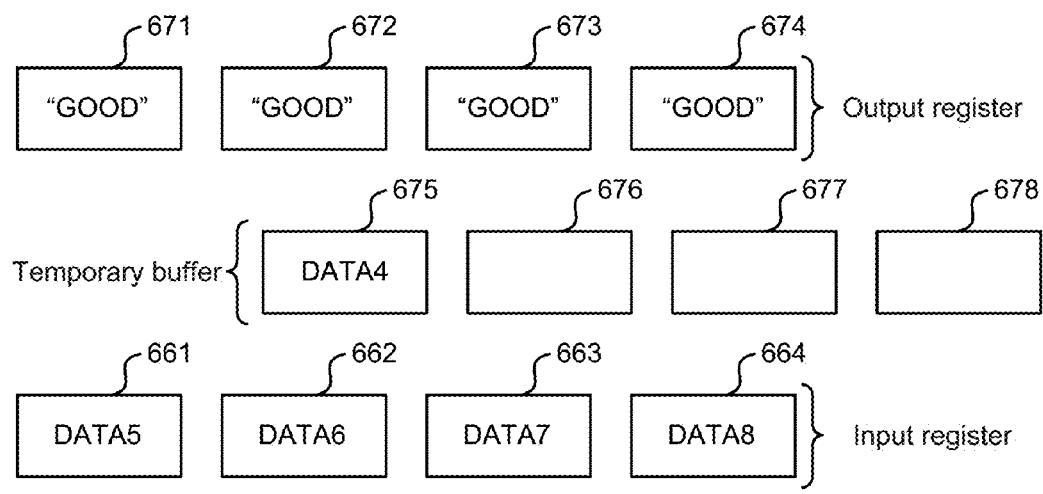

Referring to FIG. 6M, a second set of four data bytes is loaded and stored within the input register. The second set of four data bytes includes four good data bytes DATA5, DATA6, DATA7, and DATA8. As depicted in FIG. 6M, the output register maps to four good data bytes corresponding with portions of the output register 671, 672, 673, and 674. In this case, data bytes stored within the portions of the output register 671, 672, 673, and 674 will all map to good columns within the one or more memory arrays.

Figure 6N:
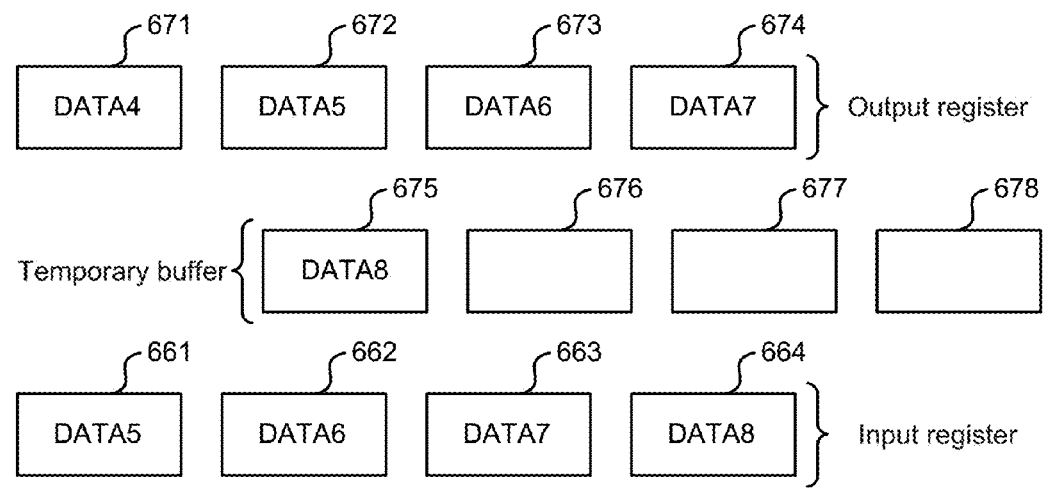

Referring to FIG. 6N, one data byte DATA4 is moved from the temporary buffer to the output register and three data bytes DATA5, DATA6, and DATA7 of the four good data bytes are moved and stored within the output register. The fourth good data byte DATA8 is moved and stored within the temporary buffer.

Figure 6O:
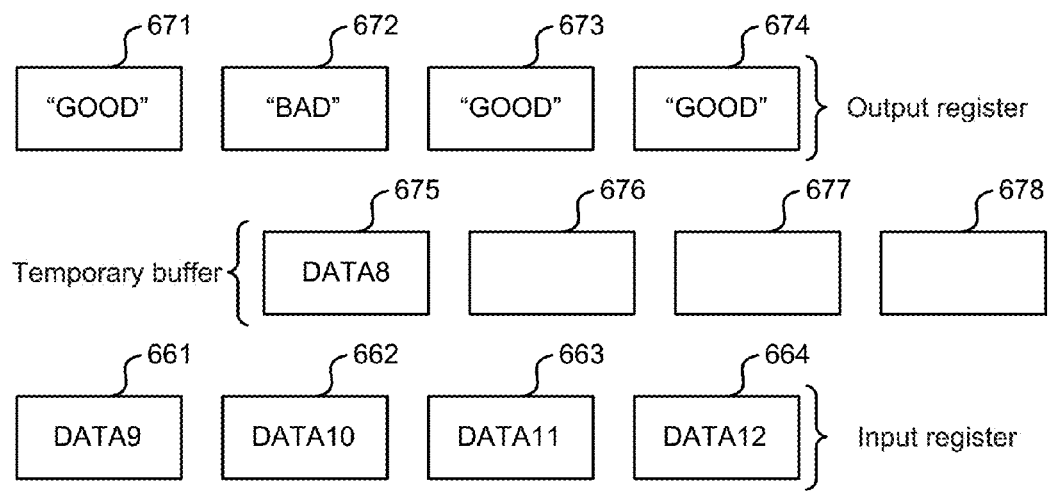

Referring to FIG. 6O, a third set of four data bytes is loaded and stored within the input register. The third set of four data bytes includes four good data bytes DATA9, DATA10, DATA11, and DATA12. As depicted in FIG. 6O, the output register maps to three good data bytes corresponding with portions of the output register 671, 673, and 674 and one bad data byte corresponding with portion of the output register 672. In this case, data bytes stored within the portions of the output register 671, 673, and 674 will map to good columns within the one or more memory arrays, while the data byte stored within the portion of the output register 672 will map to a bad column within the one or more memory arrays and therefore will not be loaded with good data.

Figure 6P:
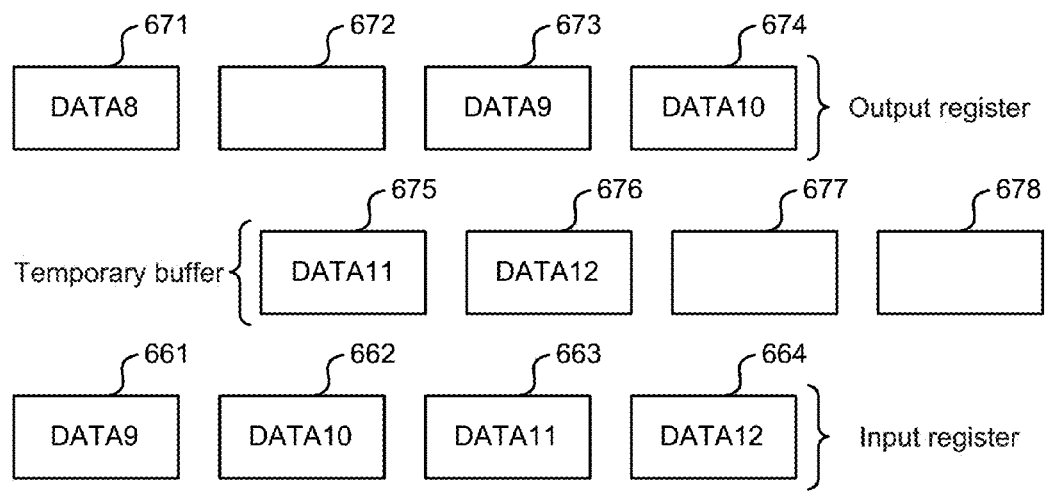

Referring to FIG. 6P, one data byte DATA8 is moved from the temporary buffer to the output register and two data bytes DATA9 and DATA10 of the four good data bytes are moved and stored within the output register. The two other good data bytes DATA11 and DATA12 are moved and stored within the temporary buffer. Once the good data bytes DATA8, DATA9, and DATA10 have been written to the output register, the data within the output register may be transferred to the one or more memory arrays.

In some embodiments, the data expand circuit 604 of FIG. 6J and the data compress circuit 644 of FIG. 6A may be combined as data expand and compress circuitry. The combined data expand and compress circuitry may include data compress logic that may reverse the data byte shuffling action of the data expand logic. The combined data expand and compress circuitry may control data flow and byte alignment between a variable data rate bi-directional FIFO and one or more memory arrays to compensate for bad column locations within the one or more memory arrays.

One embodiment of the disclosed technology includes an input register configured to store a second set of data from one or more memory arrays, a temporary buffer, an output register, and a control circuit configured to detect that the second set of data does not include data associated with a bad column within the one or more memory arrays and configured to write a subset of a first set of data from the temporary buffer to the output register in response to the detection that the second set of data does not include data associated with a bad column. The control circuit configured to write a first subset of the second set of data from the input register to the output register and configured to write a second subset of the second set of data from the input register to the temporary buffer.

One embodiment of the disclosed technology includes an input register configured to store a second set of data to be written to one or more memory arrays, a temporary buffer, an output register, and a control circuit configured to detect that the output register does not have a data mapping to a bad column within the one or more memory arrays and configured to write a subset of a first set of data from the temporary buffer to the output register in response to detection that the output register does not have a data mapping to a bad column. The control circuit configured to write a first subset of the second set of data from the input register to the output register and configured to write a second subset of the second set of data from the input register to the temporary buffer.

One embodiment of the disclosed technology includes an input register configured to store a second set of data from one or more memory arrays at a second point in time, a temporary buffer, an output register, and a control circuit configured to detect that the second set of data does not include data associated with a bad column within the one or more memory arrays and configured to write a subset of a first set of data from the temporary buffer to the output register. The control circuit configured to write a first subset of the second set of data from the input register to the output register and configured to write a second subset of the second set of data from the input register to the temporary buffer.

One embodiment of the disclosed technology includes an input register configured to store a second set of data from one or more memory arrays at a second point in time, means for detecting that the second set of data does not include data associated with one or more bad columns within the one or more memory arrays, means for writing a subset of a first set of data from a temporary buffer to an output register, and means for writing a first subset of the second set of data from the input register to the output register and writing a second subset of the second set of data from the input register to the temporary buffer.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   an input register configured to store a first set of data from one or more memory arrays;
   a temporary buffer;
   a control circuit configured to write a subset of the first set of data to the temporary buffer, the input register configured to store a second set of data from the one or more memory arrays;
   an output register; and
   the control circuit configured to detect that the second set of data does not include data associated with a bad column within the one or more memory arrays and configured to write the subset of the first set of data from the temporary buffer to the output register in response to the detection that the second set of data does not include data associated with a bad column, the control circuit configured to write a first subset of the second set of data from the input register to the output register and configured to write a second subset of the second set of data from the input register to the temporary buffer.

2. The apparatus of claim 1, wherein:
   the input register comprises data storage for M bytes of data;
   the output register comprises data storage for M bytes of data; and
   the control circuit configured to write N bytes of the first set of data less than the M bytes of data from the temporary buffer to the output register and configured to write M–N bytes of the second set of data from the input register to the output register, wherein M and N are positive integers.

3. The apparatus of claim 2, wherein:
   the control circuit configured to write N bytes of the second set of data from the input register to the temporary buffer.

4. The apparatus of claim 1, wherein:
   the input register configured to store a third set of data from the one or more memory arrays subsequent to storing the second set of data; and
   the control circuit configured to detect that the third set of data includes data associated with a bad column within the one or more memory arrays and configured to write the second subset of a second set of data from the temporary buffer to the output register, the control circuit configured to write a first subset of the third set of data from the input register to the output register and configured to write a second subset of the third set of data from the input register to the temporary buffer.

5. The apparatus of claim 4, wherein:
   the input register comprises data storage for M bytes of data;
   the output register comprises data storage for M bytes of data; and
   the control circuit configured to write N bytes of the second set of data less than the M bytes of data from the temporary buffer to the output register and configured to write M–N bytes of the third set of data from the input register to the output register, wherein M and N are positive integers.

6. The apparatus of claim 5, wherein:
   the control circuit configured to detect that the third set of data includes X bytes of data associated with one or more bad columns within the one or more memory arrays and configured to write N–X bytes of the third set of data from the input register to the temporary buffer, wherein X is also a positive integer.

7. The apparatus of claim 1, wherein:
   the input register configured to store the second set of data from one or more memory arrays at a second point in time and configured to store a third set of data from the one or more memory arrays at a third point in time subsequent to the second point in time;
   the input register configured to store M bytes of data;
   the temporary buffer configured to store N bytes of data less than the M bytes of data; and
   the control circuit configured to detect that the third set of data maps to bad column data of X bytes and that M–X bytes is less than M–N bytes, the control circuit configured to stall the transfer of data from the output register and write M–X bytes of the third set of data from the input register to the temporary buffer, wherein M, N, and X are positive integers.

8. The apparatus of claim 1, wherein:
   the one or more memory arrays comprise one of three-dimensional memory arrays or vertical NAND (NOT-AND) memory arrays.

9. The apparatus of claim 1, wherein:
   the output register transfers data to a bi-directional buffer.

10. The apparatus of claim 1, wherein:
    the one or more memory arrays comprise a non-volatile memory that is monolithically formed in one or more physical levels of memory cells having active areas disposed above a silicon substrate.

11. A system, comprising:
    an input register configured to store a first set of data from one or more memory arrays and subsequently store a second set of data from the one or more memory arrays;
    an output register;
    a bad column detection circuit configured to detect that the second set of data does not include data associated with one or more bad columns within the one or more memory arrays;
    a data transfer circuit configured to transfer a subset of the first set of data from a temporary buffer to the output register in response to the detection that the second set of data does not include data associated with one or more bad columns; and
    means for transferring a first subset of the second set of data from the input register to the output register and writing a second subset of the second set of data from the input register to the temporary buffer.

12. The system of claim 11, further comprising:
means for writing N bytes of the first set of data less than M bytes of data from the temporary buffer to the output register and writing M−N bytes of the second set of data from the input register to the output register, the input register comprises data storage for the M bytes of data and the output register comprises data storage for the M bytes of data, wherein M and N are positive integers.

13. The system of claim 12, further comprising:
means for writing N bytes of the second set of data from the input register to the temporary buffer.

14. The system of claim 11, wherein:
the one or more memory arrays comprise one of three-dimensional memory arrays or vertical NAND (NOT-AND) memory arrays.

15. An apparatus, comprising:
an input register configured to store a second set of data to be written to one or more memory arrays;
a temporary buffer;
an output register; and
a control circuit configured to detect that the output register does not have a data mapping to a bad column within the one or more memory arrays and configured to write a subset of a first set of data from the temporary buffer to the output register in response to detection that the output register does not have a data mapping to a bad column within the one or more memory arrays, the control circuit configured to write a first subset of the second set of data from the input register to the output register and configured to write a second subset of the second set of data from the input register to the temporary buffer.

16. The apparatus of claim 15, wherein:
the input register comprises data storage for M bytes of data;
the output register comprises data storage for M bytes of data; and
the control circuit configured to write N bytes of the first set of data less than the M bytes of data from the temporary buffer to the output register and configured to write M−N bytes of the second set of data from the input register to the output register, wherein M and N are positive integers.

17. The apparatus of claim 16, wherein:
the control circuit configured to write N bytes of the second set of data from the input register to the temporary buffer.

18. The apparatus of claim 15, wherein:
the input register configured to store a third set of data to be written to the one or more memory arrays; and
the control circuit configured to detect that the output register does have a data mapping to a bad column within the one or more memory arrays and configured to write the second subset of the second set of data from the temporary buffer to the output register in response to detection that the output register does have a data mapping to a bad column within the one or more memory arrays, the control circuit configured to write a first subset of the third set of data from the input register to the output register and configured to write a second subset of the third set of data from the input register to the temporary buffer.

19. The apparatus of claim 18, wherein:
the input register comprises data storage for M bytes of data;
the output register comprises data storage for M bytes of data; and
the control circuit configured to detect that the output register maps to bad column data of X bytes, the control circuit configured to write N bytes of the second set of data less than the M bytes of data from the temporary buffer to the output register and configured to write M−N−X bytes of the third set of data from the input register to the output register, the control circuit configured to write N+X bytes of the third set of data from the input register to the temporary buffer, wherein M, N, and X are positive integers.

20. The apparatus of claim 15, wherein:
the one or more memory arrays comprise one of three-dimensional memory arrays or vertical NAND (NOT-AND) memory arrays.

* * * * *